United States Patent
Nakanishi

(10) Patent No.: US 10,680,072 B2
(45) Date of Patent: Jun. 9, 2020

(54) SEMICONDUCTOR DEVICE AND MANUFACTURING METHOD THEREOF

(71) Applicant: RENESAS ELECTRONICS CORPORATION, Tokyo (JP)

(72) Inventor: Sho Nakanishi, Ibaraki (JP)

(73) Assignee: RENESAS ELECTRONICS COPORATION, Tokyo (JP)

( * ) Notice: Subject to any disclaimer, the term of this patent is extended or adjusted under 35 U.S.C. 154(b) by 15 days.

(21) Appl. No.: 16/044,956

(22) Filed: Jul. 25, 2018

(65) Prior Publication Data
US 2019/0097002 A1   Mar. 28, 2019

(30) Foreign Application Priority Data

Sep. 25, 2017   (JP) ................. 2017-184123

(51) Int. Cl.
*H01L 29/40*  (2006.01)
*H01L 29/06*  (2006.01)
(Continued)

(52) U.S. Cl.
CPC .......... *H01L 29/405* (2013.01); *H01L 29/063* (2013.01); *H01L 29/0696* (2013.01);
(Continued)

(58) Field of Classification Search
CPC . H01L 29/1095; H01L 29/404; H01L 29/405; H01L 29/063; H01L 29/0638; H01L 29/1608; H01L 29/41766; H01L 29/66348; H01L 29/66734; H01L 29/7396; H01L 29/7397; H01L 29/7811;
(Continued)

(56) References Cited

U.S. PATENT DOCUMENTS 6,150,702 A   11/2000  Funaki et al.
9,240,445 B2   1/2016  Suzuki et al.
(Continued)

FOREIGN PATENT DOCUMENTS

JP   2000-022175 A   1/2000
JP   2012-256854 A   12/2012

*Primary Examiner* — Mark W Tornow
*Assistant Examiner* — Priya M Rampersaud
(74) *Attorney, Agent, or Firm* — McDermott Will & Emery LLP

(57) ABSTRACT

The reliability of resistive field plate part-containing semiconductor device is improved. In peripheral region of semiconductor chip, the outer circumference end of internal circulation wire is separated from outer circumference end of first conductor pattern of resistive field plate part toward element region. Inner circumference end of external circulation wire is separated from inner circumference end of second conductor pattern of resistive field plate part toward outer circumference of the chip. First conductor pattern of resistive field plate part is partially extended to over thin insulation film to form first lead-out part, and internal circulation wire and first lead-out part of first conductor pattern are electrically coupled via first coupling hole. Second conductor pattern of resistive field plate part is partially extended to over thin insulation film to form second lead-out part, external circulation wire and second lead-out part of second conductor pattern are electrically coupled via second coupling hole.

17 Claims, 21 Drawing Sheets

(51) Int. Cl.
  *H01L 29/78* (2006.01)
  *H01L 29/739* (2006.01)
  *H01L 29/861* (2006.01)

(52) U.S. Cl.
  CPC ........ *H01L 29/404* (2013.01); *H01L 29/7395* (2013.01); *H01L 29/7805* (2013.01); *H01L 29/7813* (2013.01); *H01L 29/8611* (2013.01)

(58) Field of Classification Search
  CPC ............. H01L 29/7813; H01L 23/5228; H01L 23/53219; H01L 27/0802; H01L 28/20; H01L 29/0634; H01L 29/0649; H01L 29/0684; H01L 29/0692; H01L 29/0878; H01L 29/1079; H01L 29/2003; H01L 29/407; H01L 29/41708; H01L 29/41758; H01L 29/42368; H01L 29/4238; H01L 29/6634; H01L 29/66727; H01L 29/7393; H01L 29/7398; H01L 29/7436; H01L 29/7722; H01L 29/7809; H01L 29/7816; H01L 29/7823; H01L 29/861; H01L 29/0696; H01L 29/417; H01L 29/456; H01L 29/7395; H01L 29/7805; H01L 29/8611
  See application file for complete search history.

(56) References Cited

U.S. PATENT DOCUMENTS

| | | | | |
|---|---|---|---|---|
| 2004/0251499 | A1* | 12/2004 | Yamaguchi | H01L 29/404 257/343 |
| 2007/0120224 | A1* | 5/2007 | Ranjan | H01L 29/402 257/537 |
| 2008/0203496 | A1* | 8/2008 | Takahashi | H01L 29/404 257/409 |
| 2013/0168730 | A1* | 7/2013 | Ashida | H01L 29/7394 257/139 |
| 2016/0056248 | A1* | 2/2016 | Tanaka | H01L 29/405 257/329 |
| 2016/0300912 | A1* | 10/2016 | Tanaka | H01L 29/405 |

* cited by examiner

FIG. 12
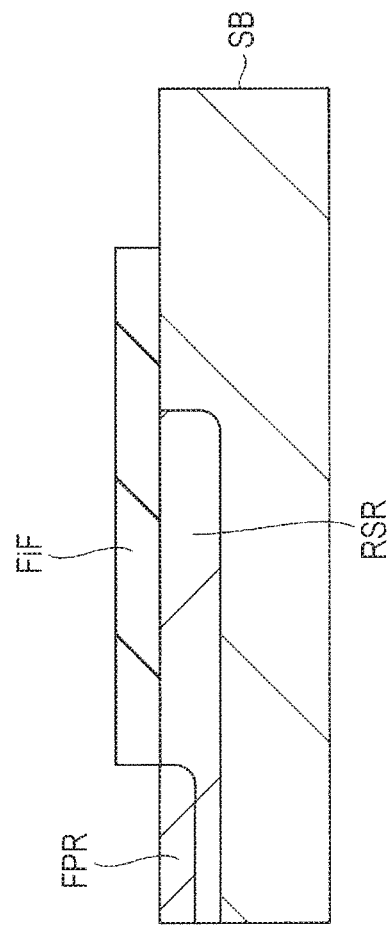
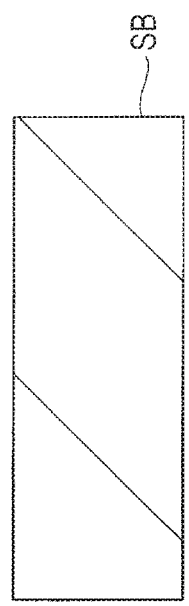

FIG. 15
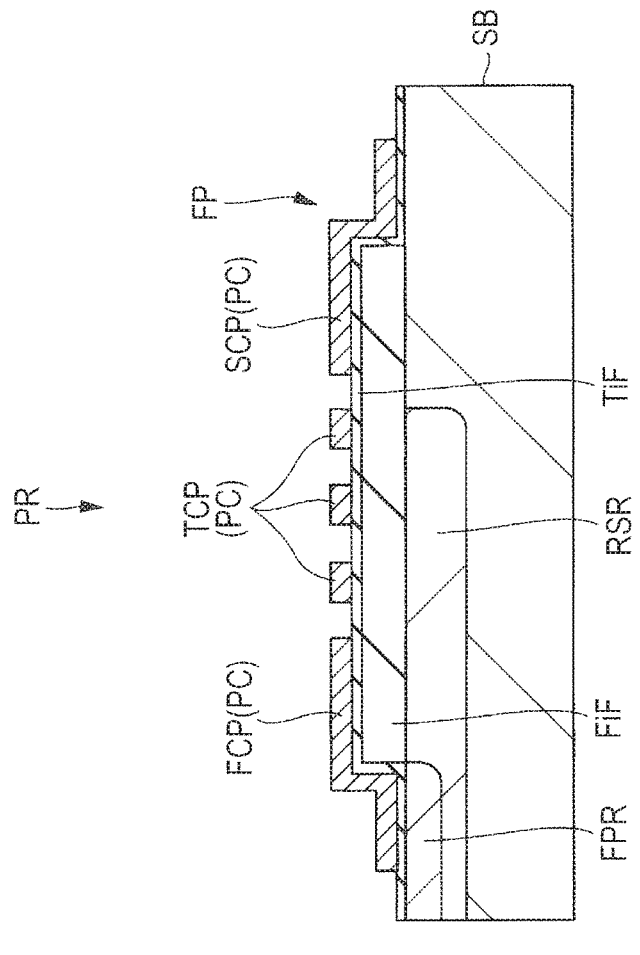
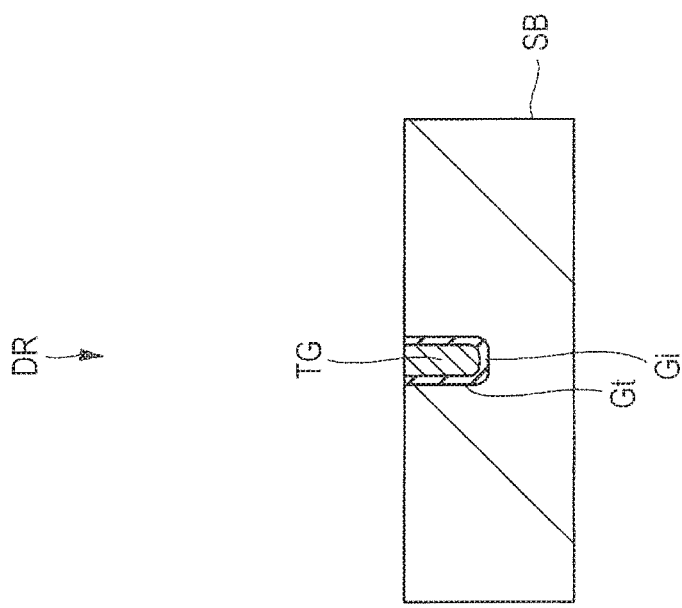

SEMICONDUCTOR DEVICE AND MANUFACTURING METHOD THEREOF

CROSS-REFERENCE TO RELATED APPLICATIONS

The disclosure of Japanese Patent Application No. 2017-184123 filed on Sep. 25, 2017 including the specification, drawings and abstract is incorporated herein by reference in its entirety.

BACKGROUND

The present invention relates to a semiconductor device and a manufacturing method thereof, and relates to, for example, a technology effectively applicable to a semiconductor device having a resistive field plate part.

A semiconductor device having a resistive field plate part is described in, for example, Patent Documents 1 and 2. Patent Document 1 discloses a configuration in which a field plate part arranged in the corner and a field plate part arranged in the linear range are not in contact with each other between the anode region and the cathode region of a diode. Further, Patent Document 2 discloses a configuration in which a track-shaped first field plate coupled with an anode electrode, and a track-shaped second field plate formed outside thereof, and coupled with a cathode electrode are coupled via two spiral field plates not crossing each other.

CITED DOCUMENTS

Patent Document

[Patent Document 1] Japanese Unexamined Patent Application Publication No. 2012-256854
[Patent Document 2] Japanese Unexamined Patent Application Publication No. 2000-22175

SUMMARY

Incidentally, a semiconductor device having a resistive field plate part has been expected to be further improved in reliability.

Other objects and novel features will be apparent from the description of this specification and the accompanying drawings.

In a semiconductor device in one embodiment, at a first surface of a semiconductor substrate forming a semiconductor chip, a first conductivity type first semiconductor region is formed in such a manner as to surround an element region, and a first insulation film is formed in such a manner as to surround the outer circumference. Further, over the first surface inside and outside the first insulation film, a second insulation film thinner than the first insulation film is formed. Furthermore, over the first insulation film and the second insulation film in the outer circumference region at the outer circumference of the element region, a conductor plate part is formed in such a manner as to surround the element region. The conductor plate part includes a first conductor pattern surrounding the element region in a plan view, a second conductor pattern surrounding the first conductor pattern in a plan view, and a third conductor pattern arranged between the first conductor pattern and the second conductor pattern in a plan view, and, for electrically coupling the first conductor pattern and the second conductor pattern. Further, over the first surface of the semiconductor substrate, a third insulation film is deposited in such a manner as to cover the first insulation film, the second insulation film, and the conductor plate part. Furthermore, over the third insulation film, a first metal pattern is formed in such a manner as to surround the element region inside the conductor plate part in a plan view. Further, a second metal pattern is formed in such a manner as to surround the first metal pattern outside the conductor plate part in a plan view. Then, the outer circumference end of the first metal pattern is separated from the outer circumference end of the first conductor pattern toward the element region.

In accordance with one embodiment, the reliability of a semiconductor device having a resistive field plate part can be improved.

BRIEF DESCRIPTION OF THE DRAWINGS

FIG. 12 is an essential part cross sectional view of the element region (left) and the peripheral region (right) of a semiconductor substrate of the semiconductor device of FIG. 1 during a manufacturing step;

FIG. 15 is an essential part cross sectional view of the element region (left) and the peripheral region (right) of the semiconductor substrate of the semiconductor device during a manufacturing step after the step of FIG. 14;

DETAILED DESCRIPTION

In description of the following embodiment, the embodiment maybe described in a plurality of divided sections or embodiments for convenience, if required. However, unless otherwise specified, these are not independent of each other, but are in a relation such that one is a modification example, a detailed description, complementary explanation, or the like of a part or the whole of the other.

Further, in the following embodiments, when a reference is made to the number of elements, and the like (including number, numerical value, quantity, range, or the like), the number of elements is not limited to the specific number, but may be greater than or less than the specific number, unless otherwise specified, except for the case where the number is apparently limited to the specific number in principle, or except for other cases.

Further, in the following embodiments, it is naturally understood that the constitutional elements (including element steps, or the like) are not always essential, unless otherwise specified, except for the case where they are apparently considered essential in principle, or except for other cases.

Similarly, in the following embodiments, when a reference is made to the shapes, positional relationships, or the like of the constitutional elements, or the like, it is understood that they include ones substantially analogous or similar to the shapes or the like, unless otherwise specified, unless otherwise considered apparently in principle, or except for other cases. This also applies to the foregoing numerical values and ranges.

Further, in all the drawings for describing the embodiments, the same members are given the same reference sign and numeral in principle, and a repeated description thereon is omitted. Incidentally, hatching may be added even in a plan view for ease of understanding of the drawings.

Further, the term "plan view" in embodiments means the view as seen from a direction perpendicular to the first main surface and the second main surface of the semiconductor chip or the semiconductor substrate.

Further, in the terms of the present specification, "electrode" may be used as apart of "wire". Whereas, conversely, "wire" may be used as a part of "electrode".

Study Results by the Inventors

Figure 28:
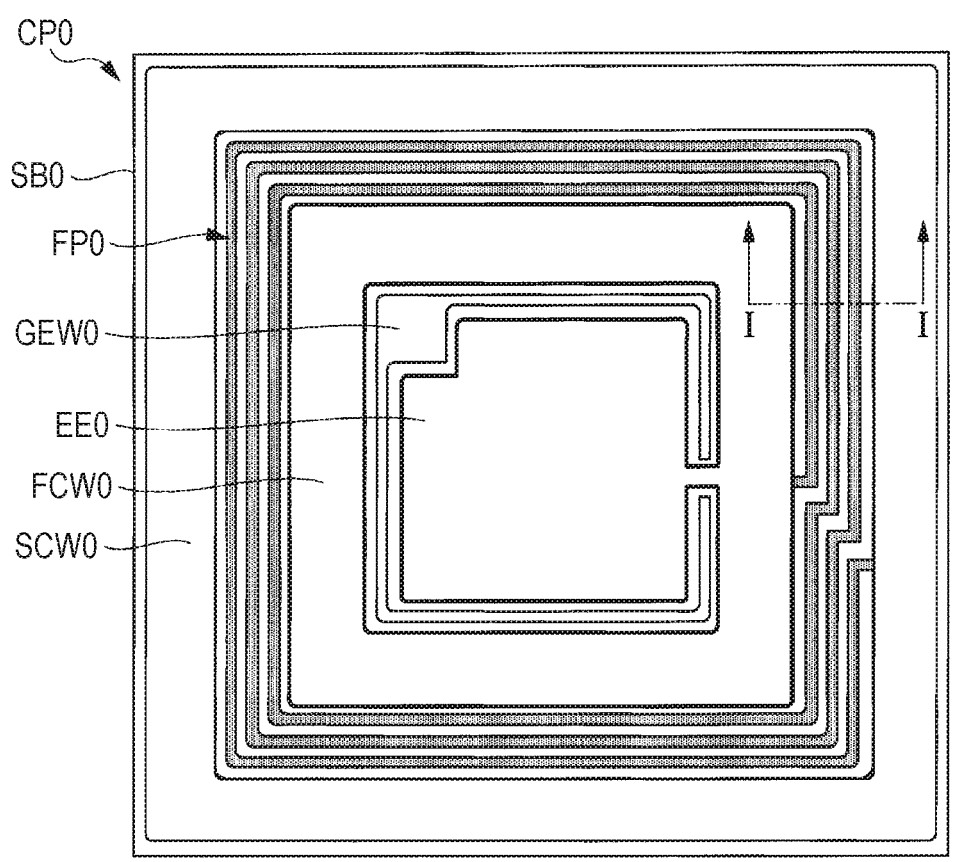
FIG. 28 is a plan view of a semiconductor chip forming a semiconductor device having a resistive field plate part.

First, the general structure example of a semiconductor device having a resistive field plate part will be described in brief. FIG. 28 is a plan view of a semiconductor chip forming a semiconductor device having a resistive field plate part.

At the center of the main surface of a semiconductor chip CP0, an emitter electrode EE0 is arranged. The emitter electrode EE0 is electrically coupled with the emitter region of a power transistor formed at the semiconductor chip CP0. At the outer circumference of the emitter electrode EE0, a gate electrode wire GEW0 is arranged in such a manner as to surround the emitter electrode EE0. The gate electrode wire GEW0 is electrically coupled with the gate electrode of the power transistor. At the outer circumference of the gate electrode wire GEW0, an internal circulation wire FCW0 is arranged in such a manner as to surround the gate electrode wire GEW0. The internal circulation wire FCW0 is formed integrally with the emitter electrode EE0 on the inner side, and is electrically coupled with the emitter electrode EE0. At the outer circumference of the internal circulation wire FCW0, an external circulation wire SCW0 is arranged via a resistive field plate part FP0 (hatched portion) at a lower layer. The external circulation wire SCW0 is electrically coupled with the collector region of the power transistor.

The resistive field plate part FP0 is formed of conductor patterns FCP0, TCP0, and SCP0 for establishing an electric coupling between collector and emitter of the power transistor. The conductor patterns FCP0, TCP0, and SCP0 forming the resistive field plate part FP0 each include a resistance formed of polysilicon, or the like, and is formed, for example, in a spiral shape. An electric current is passed through the conductor patterns FCP0, TCP0, and SCP0 forming the resistive field plate part FP0. As a result, a field plate having a given electric potential is formed, so that the potential distribution thereof ensures the breakdown voltage of the peripheral region.

Figure 29:
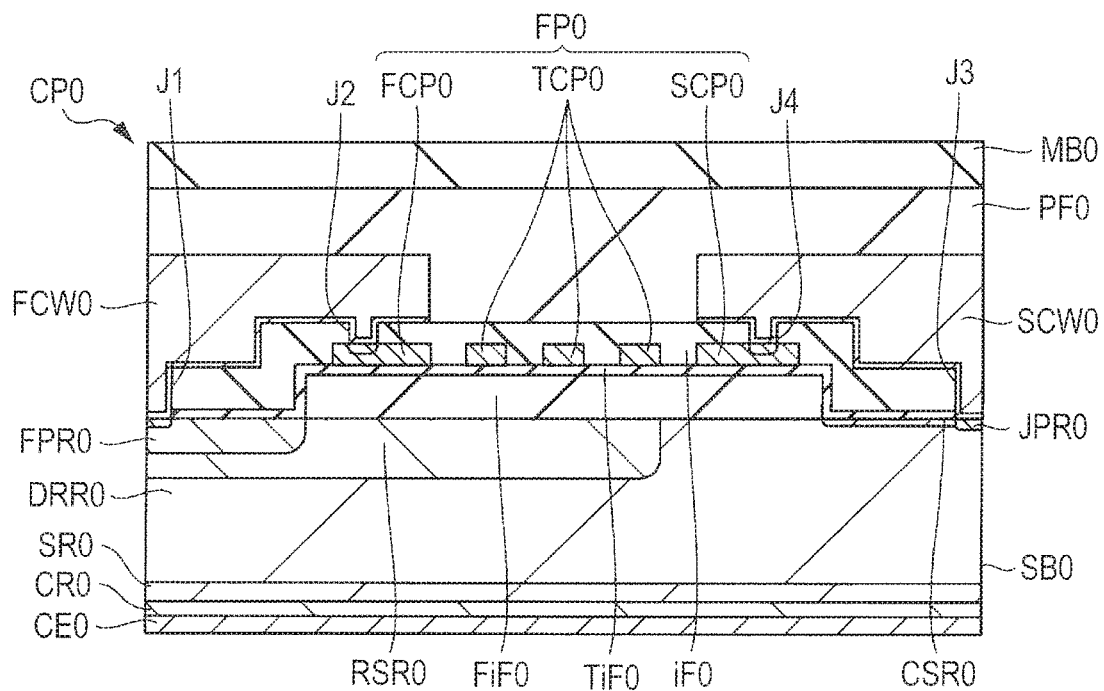
FIG. 29 is a cross sectional view along line I-I of the peripheral region of the semiconductor chip of FIG. 28.

FIG. 29 is a cross sectional view along line I-I of the peripheral region of the semiconductor chip of FIG. 28. At the main surface of a semiconductor substrate SB0 (n⁻ type drift region DRR0) forming the semiconductor chip CP0, a p type semiconductor region FPR0, and a p⁻ type resurf region RSR0 having a lower impurity density than that are formed in such a manner as to surround the element region. The resurf region RSR0 extends toward the outer circumference of the semiconductor chip CP0 while being electrically coupled with the p type semiconductor region FPR0, and is formed immediately under the conductor pattern of the resistive field plate part FP0.

Further, outside the resurf region RSR0, an $n^+$ type channel stopper region CSR0 and a $p^+$ type semiconductor region JPR0 are formed in such a manner as to surround the element region. Incidentally, a collector electrode CE0 is formed in the back surface opposite to the main surface of the semiconductor substrate SB0. The collector electrode CE0 is bonded with the p type collector region CR0 formed in the back surface of the semiconductor substrate SB0. An n type field stop region SR0 is formed between the p type collector region CR0 and the $n^-$ type drift region DRR0. Further, over the main surface of the semiconductor substrate SB0, a relatively thicker insulation film FiF0 is formed in such a manner as to surround the p type semiconductor region FPR0 in a plan view. Over the thick insulation film FiF0, the conductor patterns FCP0, TCP0, and SCP0 of the resistive field plate part FP0 are formed. Then, over the main surface of the semiconductor substrate SB0, an insulation film iF0 is deposited in such a manner as to cover the resistive field plate part FP0 and the thick insulation film FiF0. Over the insulation film iF0, the internal circulation wire FCW0 and the external circulation wire SCW0 are formed.

The internal circulation wire FCW0 is electrically coupled with the p type semiconductor region FPR0 through a coupling hole J1, and is electrically coupled with the inner conductor pattern FCP0 of the resistive field plate part FP0 through a coupling hole J2. Further, the external circulation wire SCW0 is electrically coupled with the $p^+$ type semiconductor region JPR0 and the $n^+$ type channel stopper region CSR0 through a coupling hole J3, and is electrically coupled with the outer conductor pattern SCP0 of the resistive field plate part FP0 through a coupling hole J4. Incidentally, over the insulation film iF0, a surface protective film PF0 is deposited in such a manner as to cover the internal circulation wire FCW0 and the external circulation wire SCW0. Further, over the surface protective film PF0, a sealing body MB0 forming the package is shown.

Figure 30:
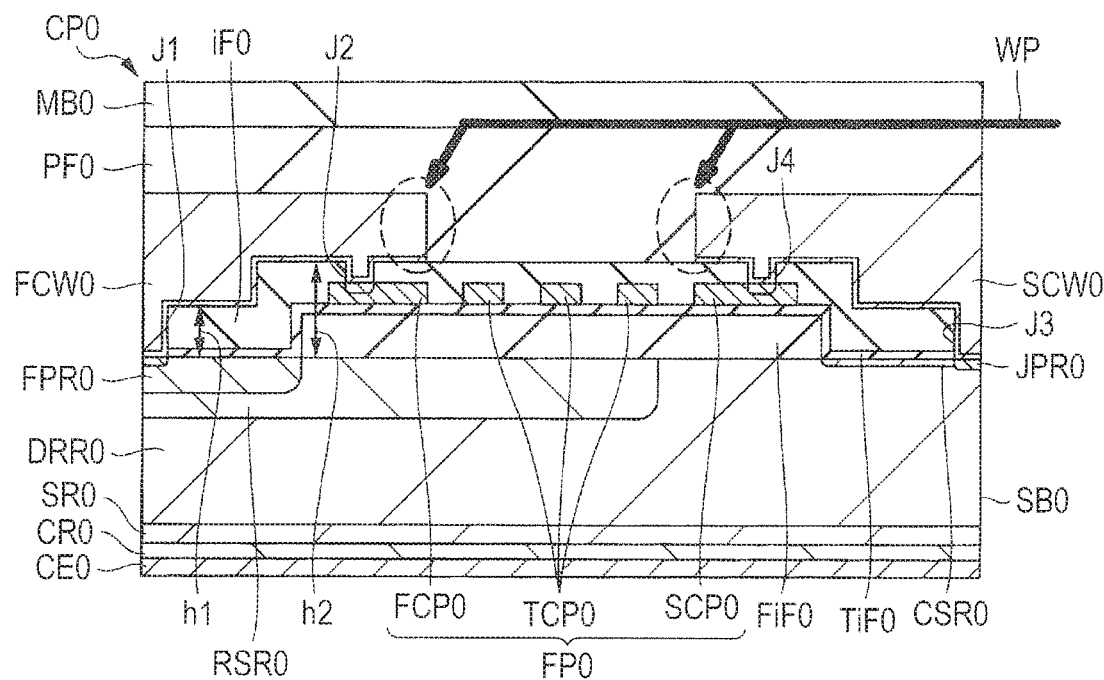
FIG. 30 is a cross sectional view along line I-I of the peripheral region for describing the problem of the semiconductor chip of FIG. 28.

Then, a description will be given to the problem of the semiconductor device having the resistive field plate part FP0 as described above. FIG. 30 is a cross sectional view along line I-I of the peripheral region for describing the problem of the semiconductor chip of FIG. 28.

With the peripheral structure using the resistive field plate part FP0 as described above, the current passing through the conductor patterns FCP0, TCP0, and SCP0 fixes the electric potential distribution between collector and emitter. For this reason, the structure is less likely to be affected by an external electric charge also in terms of the reliability, and becomes a tough structure. However, a study by the inventors has proved that a defective moisture resistance is caused according to the package specifications. Particularly, a defective moisture resistance tends to be caused when the adhesion between the surface protective film PF0 and the sealing body MB0 on the main surface side of the semiconductor chip is very low. This is considered to be due to the following fact; the surface protective film PF0 and the sealing body MB0 are released from each other by the thermal stress during the reliability test; an excessive moisture penetrates into the package through the released portion. That is, with the semiconductor device studied by the inventors, the outer circumference end of the internal circulation wire FCW0, and the outer circumference end of the inner conductor pattern FCP0 of the underlying resistive field plate part FP0 are in agreement with each other. Further, the inner circumference end of the external circulation wire SCW0, and the inner circumference end of the outer conductor pattern SCP0 of the underlying resistive field plate part FP0 are in agreement with each other. For this reason, practical use of the effects of the resistive field plate part FP0 results in a higher electric field of the vicinity of the outer circumference end of the internal circulation wire FCW0 and the inner circumference end of the external circulation wire SCW0 (the region surrounded by a broken line of FIG. 30). Particularly, the electric field is high in the vicinity of the resistive field plate part FP0 near the p type semiconductor region FPR0. For this reason, when the outer circumference end of the internal circulation wire FCW0 and the outer circumference end of the conductor pattern FCP0 are in agreement with each other, the electric field of the outer circumference end of the internal circulation wire FCW0 becomes higher ($3 \times 10^5$ V/cm or more). As a result, the internal circulation wire FCW0 and the external circulation wire SCW0 become more likely to be affected by the excessive moisture. This has been proved by the study by the inventors. That is, when a moisture resistance test is carried out in this state, as indicated with an arrow WP, an excessive moisture penetrates from the outside into the package through the released portion between the surface protective film PF0 (or the frame) and the sealing body MB0. Then, the ions in the resin contained in the moisture (mainly, in addition to halogen components such as bromine ion ($Br^-$) or chlorine ion ($Cl^-$), sodium ion ($Na^+$), and the like) become an electrolyte. This results in corrosion of aluminum forming the internal circulation wire FCW0 and the external circulation wire SCW0, and a barrier conductor film. When corrosion of the internal circulation wire FCW0 and the external circulation wire SCW0 proceeds, and reaches to the coupling part of the resistive field plate part FP0, the conductor pattern of the resistive field plate part FP0 is oxidized, leading to disconnection of the resistive field plate part FP0. Further, when the barrier conductor film of the internal circulation wire FCW0 and the external circulation wire SCW0 is corroded, oxidized, and expands, cracking is caused in aluminum, resulting in acceleration of moisture penetration. Then, finally, the resistive field plate part FP0 undergoes disconnection, so that the breakdown voltage is reduced, and becomes poor (first problem).

Further, in accordance with an increase in breakdown voltage, in order to ensure the reliability, the electric field relaxation in the oxide film and at the interlayer film interface between the surface protective film PF0 and the insulation film iF0 is also necessary. As a countermeasure thereagainst, generally, it is considered effective to increase the film thicknesses of the insulation film iF0 and the thick insulation film FiF0 over and under the resistive field plate part FP0. However, the increase in film thickness of the insulation film causes a step difference as large as 1 to 2 μm between the upper surface height h1 of the insulation film iF0 at the coupling position between the internal circulation wire FCW0 and the p type semiconductor region FPR0, and the upper surface height h2 of the insulation film iF0 at the coupling position between the internal circulation wire FCW0 and the resistive field plate part FP0. As a result, in the photolithography step for forming the coupling hole J1 for coupling the internal circulation wire FCW0 and the p type semiconductor region FPR0, and the coupling hole J2 for coupling the internal circulation wire FCW0 and the inner conductor pattern FCP0, defocus is caused, resulting in defective shape and diameter of the coupling hole. This also applies to the photolithography step for forming the coupling hole J3 for coupling the external circulation wire SCW0 and the $p^+$ type semiconductor region JPR0, and the coupling hole J4 for coupling the external circulation wire SCW0 and the outer conductor pattern SCP0 (second problem). Particularly, with a narrow mesa type IGBT (Insulated Gate Bipolar Transistor) and a power MOSFET (Metal Oxide Semiconductor Field Effect Transistor) which have been becoming the main stream, in order to improve the current density, and to reduce the ON resistance, the diameter of the coupling hole has also been narrowed with a decrease in cell pitch. Then, in order to achieve the void-less state in the coupling hole, a plug process (such as a tungsten plug) is often used. The plug process is demanded to be reduced in process cost by unifying the diameters of the coupling holes, thereby suppressing an increase in number of masks for forming coupling holes not limited to the element region and the peripheral region. However, when the foregoing problem of defocus occurs, it becomes impossible to form the coupling holes in the element region, and the coupling holes in the peripheral region by the same mask (the same photolithography step). This results in an increase in number of steps, leading to a higher process cost.

Below, a description will be given to a specific example for solving the first and second problems.

First Embodiment

Configuration Example of Semiconductor Device

Figure 1:
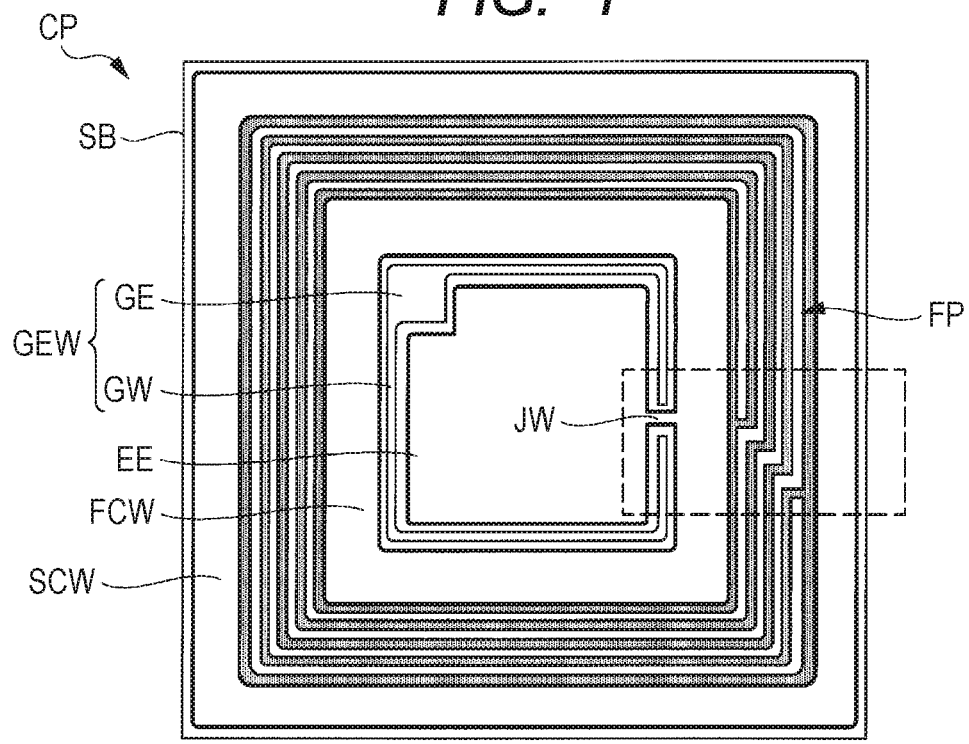
FIG. 1 is a plan view of a semiconductor chip forming a semiconductor device of First Embodiment.

FIG. 1 is a plan view of a semiconductor chip forming a semiconductor device of First Embodiment.

A semiconductor chip (which will be hereinafter simply referred to as a chip) CP forming the semiconductor device of First Embodiment is, for example, a power device including a power transistor (electric power type transistor). A semiconductor substrate (which will be hereinafter simply referred to as a substrate) SB forming the chip CP is formed of, for example, a silicon (Si) single crystal, and has a first surface, and a second surface opposite thereto. The first surface and the second surface are each formed in a tetragonal shape in a plan view.

At the in-plane center of the uppermost wiring layer of the chip CP, an emitter electrode (first electrode) EE is arranged. The emitter electrode EE is formed of a lamination conductor film obtained by stacking, over a barrier conductor film, a main conductor film thicker than that as described later, and is formed in, for example, a substantially square shape in a plan view.

Further, at the outer circumference of the emitter electrode EE at the uppermost wiring layer, a gate electrode wire GEW is arranged. The gate electrode wire GEW is formed of the same conductor film as that of the emitter electrode EE, and has a gate electrode part GE, and a gate wire part GW in an integral form. The gate electrode part GE is formed in, for example, a substantially square shape in a plan view, and is arranged in the vicinity of one corner part of the emitter electrode EE. Further, the gate wire part GW is formed in a band-shaped pattern with a narrower width than that of the gate electrode part GE, and is arranged in such a manner as to surround the emitter electrode EE.

Further, at the outer circumference of the gate electrode wire GEW at the uppermost wiring layer, an internal circulation wire (first metal pattern) FCW is arranged in such a manner as to surround the gate electrode wire GEW. The internal circulation wire FCW is electrically coupled with the emitter electrode EE through a coupling wiring part JW at the uppermost wiring layer. The internal circulation wire FCW, the coupling wiring part JW, and the emitter electrode EE are formed of the same conductor film, and are integrally formed.

Further, at the outer circumference of the internal circulation wire FCW at the uppermost wiring layer, an external circulation wire (second metal pattern) SCW is arranged in such a manner as to surround the internal circulation wire FCW. The external circulation wire SCW is formed of the same conductor film as that of the emitter electrode EE.

Furthermore, at a wiring layer immediately under the uppermost wiring layer, a resistive field plate part (conductor plate part) FP is arranged between the internal circulation wire FCW and the external circulation wire SCW. For ease of understanding of the drawing, the resistive field plate part FP is hatched. The resistive field plate part FP will be described later.

Figure 2:
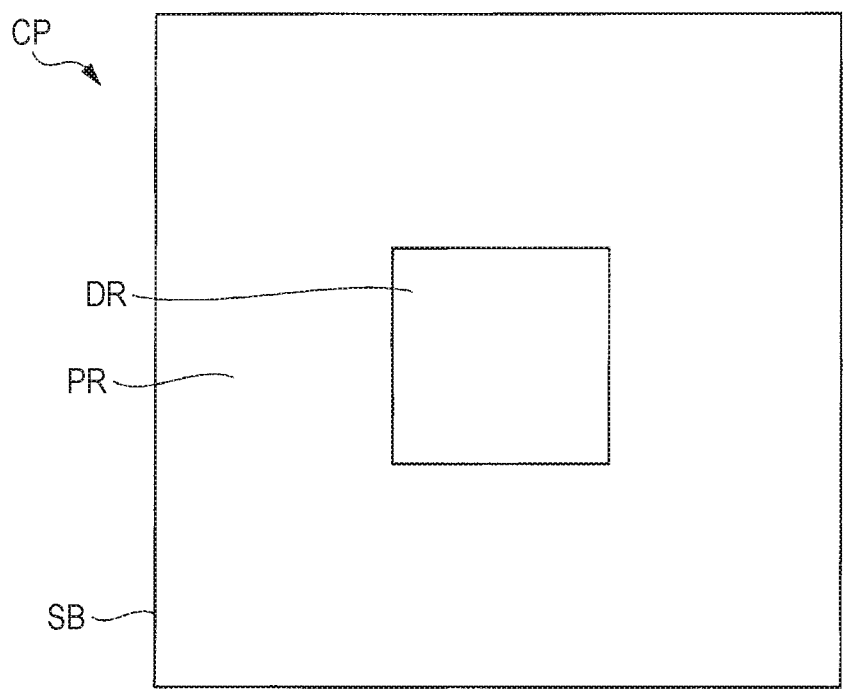
FIG. 2 is a plan view of a substrate layer of the semiconductor chip of FIG. 1.

Then, FIG. 2 is a plan view of a substrate layer of the chip of FIG. 1.

At the center of the first surface of the substrate SB forming the chip CP, an element region (active region, internal circumference region) DR is arranged. Further, at the outer circumference of the element region DR at the first surface of the substrate SB, the peripheral region (outer circumference region) PR is arranged in such a manner as to surround the element region DR.

In the element region DR, a plurality of transistor cells are arranged. The plurality of transistor cells are electrically coupled with one another, thereby to form a power transistor. Below, first, the transistor cells in the element region DR will be described. Then, the peripheral region PR will be described.

Figure 3:
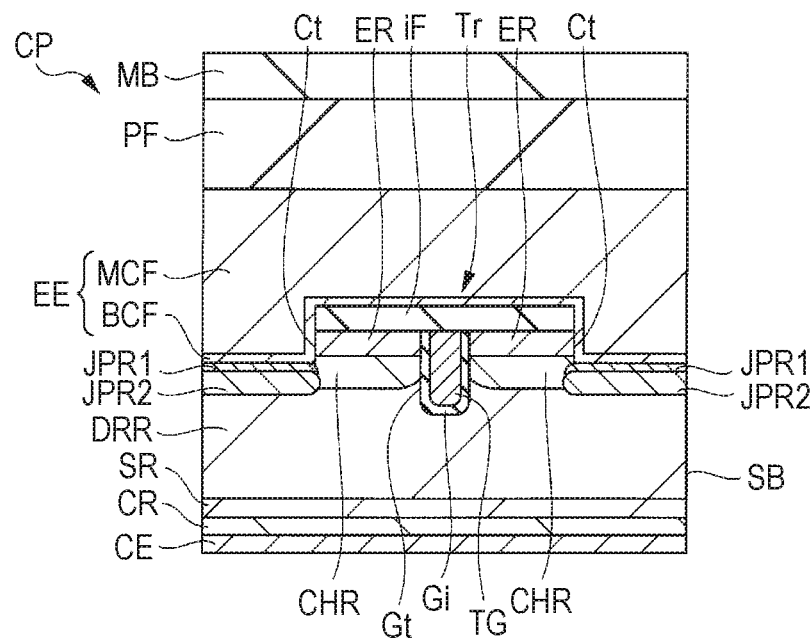
FIG. 3 is an essential part cross sectional view of one example of a transistor cell arranged at an element region of FIG. 2.

FIG. 3 is an essential part cross sectional view of one example of the transistor cell arranged in the element region of FIG. 2.

As the transistor cell, for example, a mesa type insulation gate bipolar transistor (IGBT: which will be hereinafter simply referred to as a transistor) Tr is formed. The transistor (element) Tr has a p type collector region CR, an n type emitter region ER, and an n⁻ type drift region DRR, and a p type channel formation region CHR therebetween, and a trench gate electrode TG.

At a second surface (generally, a back surface) of the substrate SB, the p type collector region CR is formed. The collector region CR includes a p type semiconductor region, and is electrically coupled with a collector electrode (second electrode) CE bonded to the second surface of the substrate SB. The collector electrode CE includes, for example, aluminum (Al), titanium (Ti), nickel (Ni), and gold (Au) sequentially stacked, and is formed in such a manner as to cover the entire region of the second surface of the substrate SB.

Further, between the p type collector region CR and the n⁻ type drift region DRR, an n type field stop region SR is formed. The field stop region SR has a function of preventing the occurrence of a punch through phenomenon (a phenomenon in which the depletion layer growing from the channel formation region CHR into the drift region DRR comes in contact with the collector region CR) when the transistor Tr is turned off. Further, the field stop region SR also has a function of limiting the amount of holes to be implanted from the collector region CR to the drift region DRR.

On the other hand, at the first surface (generally, a main surface) of the substrate SB, an n type emitter region ER is formed. The emitter region ER includes an n type semiconductor region. In the first surface of the substrate SB, a gate trench Gt penetrating through the emitter region ER and the underlying channel formation region CHR, and reaching the drift region DRR is formed. In the gate trench Gt, a trench gate electrode TG is embedded via a gate insulation film Gi. The gate insulation film Gi is formed of, for example, a silicon oxide film ($SiO_2$). The trench gate electrode TG is formed of, for example, a low-resistance polysilicon film. The trench gate electrode TG is electrically coupled with the gate electrode wire GEW.

Further, over the first surface of the substrate SB, an insulation film (third insulation film) iF is deposited in such a manner as to cover the upper surfaces of the emitter region ER and the trench gate electrode TG. The insulation film iF is formed of, for example, a silicon oxide film, and has a thickness of, for example, about 1 μm. Over the insulation film iF, the emitter electrode EE is formed.

The emitter electrode EE is formed of a lamination film of a barrier conductor film BCF, and a main conductor film MCF deposited thereover thicker than the barrier conductor film BCF. The barrier conductor film BCF includes, for example, titanium tungsten (TiW). The main conductor film MCF is formed of, for example, a simple substance film of aluminum (Al), a conductor film obtained by adding Si or Copper (Cu) to Al, or a conductor film obtained by adding Si and Cu thereto. Out of these, AlSi is preferable from the viewpoint of suppressing Al spike. The content of Si in Al falls within the range of, for example, 0.5% to 1.5%.

Further, in the first surface of the substrate SB, a coupling trench Ct penetrating through the insulation film iF and the emitter region ER, and reaching the channel formation region CHR is formed. Then, the emitter electrode EE is electrically coupled with the emitter region ER through the side surface of the coupling trench Ct. Further, the emitter electrode EE is electrically coupled with a p type channel formation region CHR through $p^+$ type semiconductor regions JPR1 and JPR2 formed at the substrate SB at the bottom of the coupling trench Ct.

Further, the emitter electrode EE is covered with a surface protective film PF. The surface protective film PF is formed of a resin such as polyimide. Furthermore, over the surface protective film PF, apart of a sealing body MB forming the package is shown. The sealing body MB is formed of, for example, an epoxy type resin.

As the transistor cell, a power MOSFET may be formed in place of the IGBT. However, when the material for the substrate SB is Si, IGBT can increase the breakdown voltage even if the substrate SB is reduced in thickness. That is, IGBT can more reduce the ON resistance. However, when the material for the substrate SB is silicon carbide (SiC), even a power MOSFET can ensure the breakdown voltage, and can reduce the ON resistance even if the substrate SB is reduced in thickness. Alternatively, in place of an IGBT or a power MOSFET, other transistors such as RC (Reverse-Conducting)-IGBT and a bipolar transistor (Bipolar Transistor) may be adopted as transistor cells.

Figure 4:
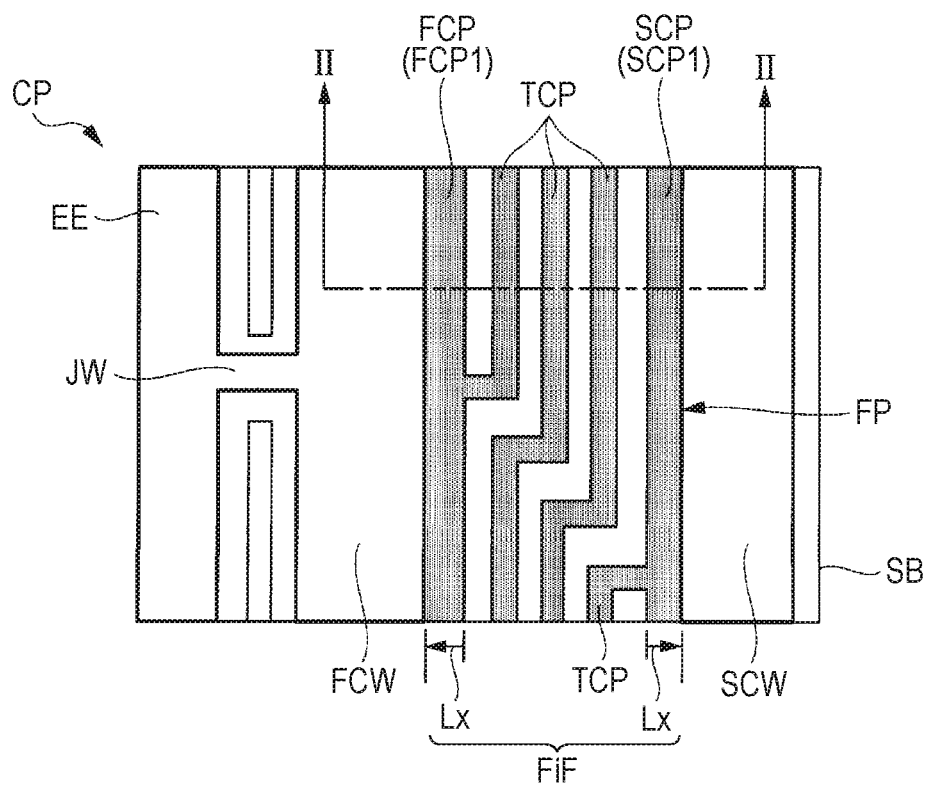
FIG. 4 is an enlarged plan view of a region surrounded by a broken line of the semiconductor chip of FIG. 1.
Figure 5:
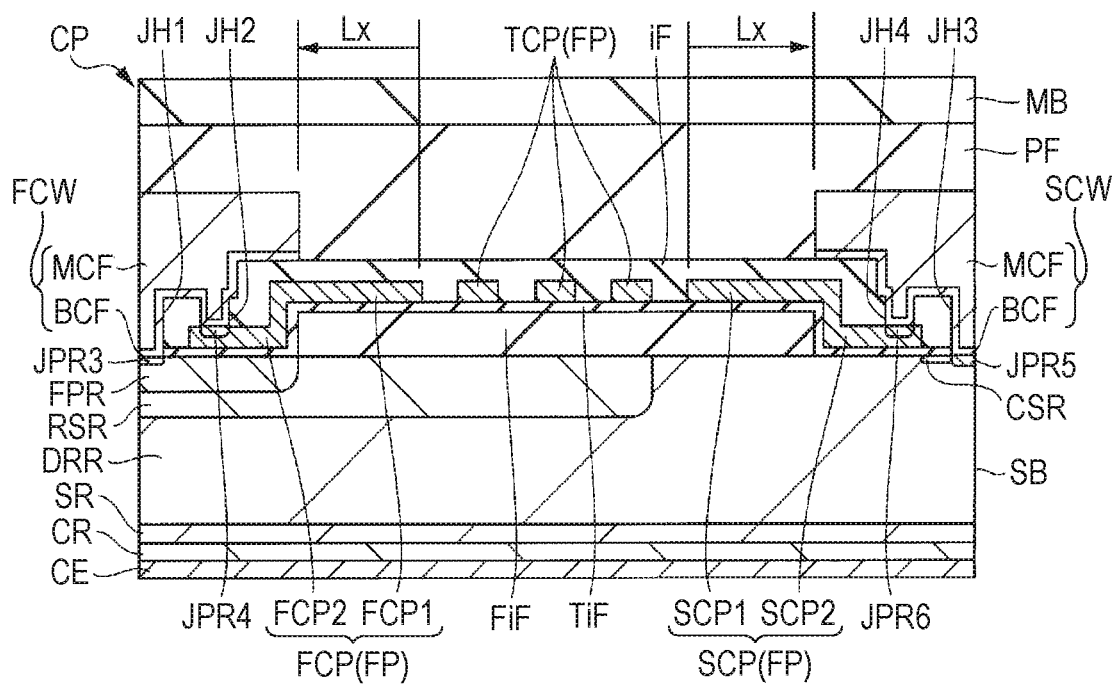
FIG. 5 is a cross sectional view along line II-II of FIG. 4.
Figure 6:
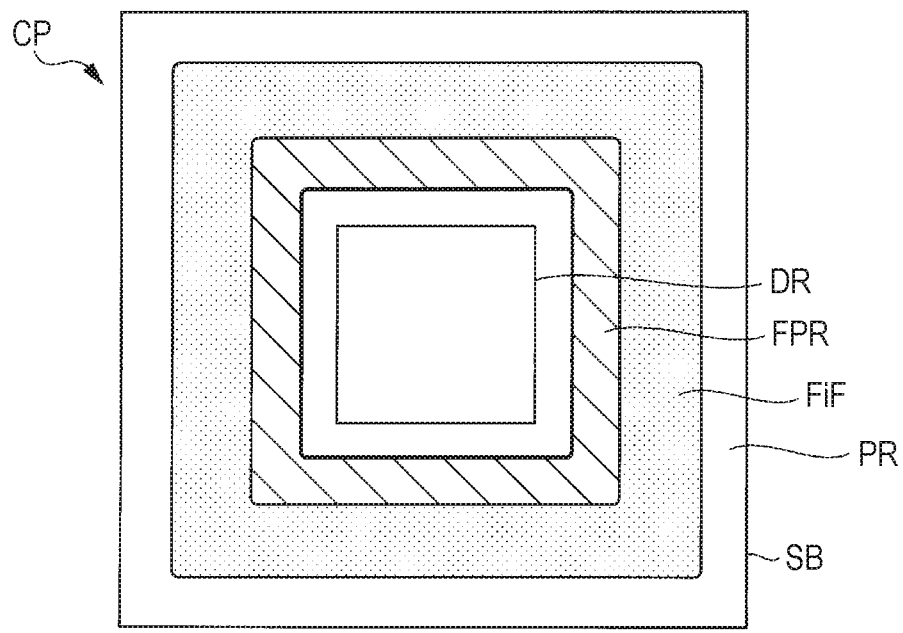
FIG. 6 is a plan view of the semiconductor chip shown by superposing a p type semiconductor region and a thick insulation film at a first surface of the semiconductor chip of FIG. 2.
Figure 7:
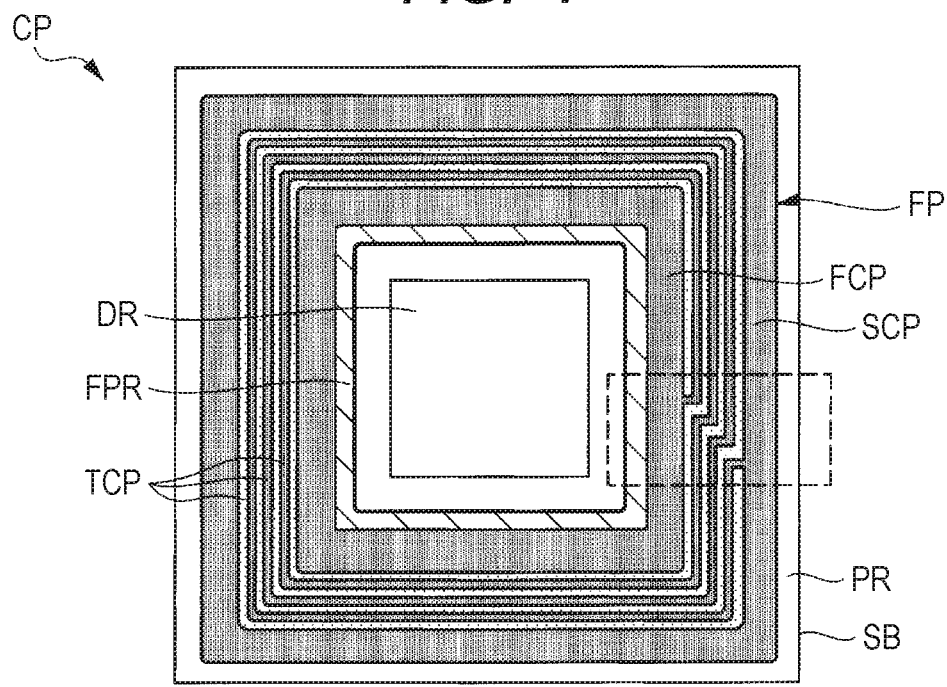
FIG. 7 is a plan view of the semiconductor chip shown by superposing a resistive field plate part at the first surface of the semiconductor chip of FIG. 6.
Figure 8:
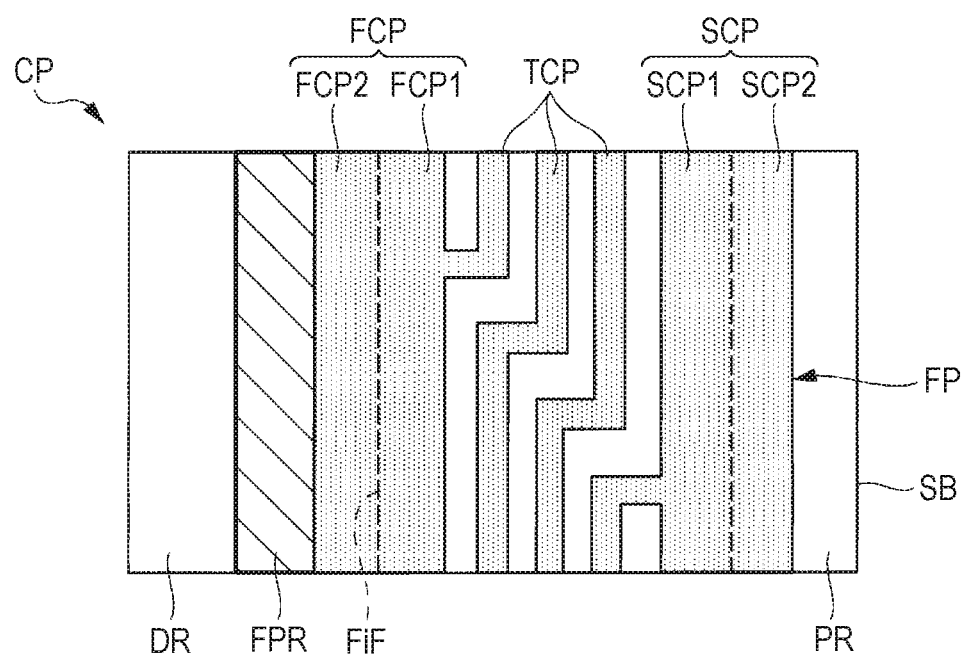
FIG. 8 is an enlarged plan view of a region surrounded by a broken line of the semiconductor chip of FIG. 7.
Figure 9:
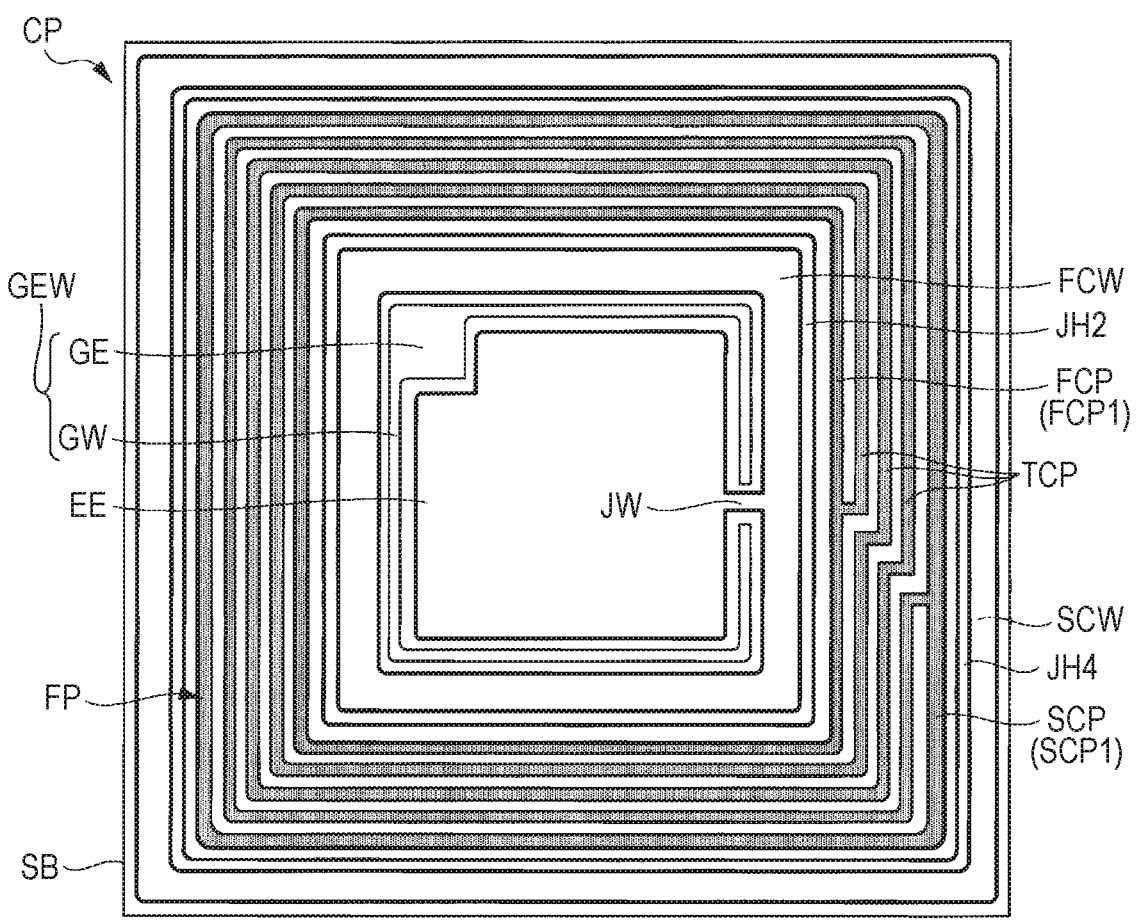
FIG. 9 is a plan view of the semiconductor chip showing the arrangement of coupling holes for coupling an internal circulation wire and an external circulation wire, and a resistive field plate part.

Then, a description will be given to the peripheral region of the chip CP (substrate SB). FIG. 4 is an enlarged plan view of a region surrounded by a broken line of the chip of FIG. 1; FIG. 5 is a cross sectional view along line II-II of FIG. 4. Further, FIG. 6 is a plan view of a chip shown by superposing a p type semiconductor region and a thick insulation film on a first surface of the chip of FIG. 2; FIG. 7 is a plan view of the chip shown by superposing a resistive field plate part on the first surface of the chip of FIG. 6; and FIG. 8 is an enlarged plan view of a region surrounded by a broken line of the chip of FIG. 7. Further, FIG. 9 is a plan view of the chip showing the arrangement of coupling holes for coupling the internal circulation wire and the external circulation wire, and the resistive field plate part.

As shown in FIG. 5, in the peripheral region of the chip CP, a p type semiconductor region (first semiconductor region) FPR, and a $p^-$ type resurf region RSR having a lower impurity density than that are formed at the first surface of the substrate SB. The planar configuration of the p type semiconductor region FPR is formed in a frame shape in a plan view in such a manner as to surround the element region DR as shown in FIGS. 6 and 7. The p type semiconductor region FPR is fixed at an electric potential of 0 V during the OFF state of the power transistor.

Further, the $p^-$ type resurf region RSR is also formed in such a manner as to surround the element region DR. The resurf region RSR extends toward the outer circumference of the chip CP while being electrically coupled with the p type semiconductor region FPR, and is formed immediately under the resistive field plate part (conductor plate part) FP. The combination of the resistive field plate part FP and the resurf region RSR has good compatibility in terms of the breakdown voltage characteristics. Provision of the resurf region RSR can relax the surface electric field of the first surface of the substrate SB, and can improve the breakdown voltage.

Further, at the first surface of the substrate SB, a channel stopper region CSR is formed in such a manner as to surround the resistive field plate part FP further outside the resistive field plate part FP. The channel stopper region CSR has a function of suppressing the extension of the depletion layer extending from the p type semiconductor region FPR. The channel stopper region CSR is fixed at an electric potential of about 600 V during the OFF state of the power transistor.

Further, as shown in FIG. 5, over the first surface of the substrate SB, a thick insulation film (first insulation film) FiF is formed, and a thin insulation film (second insulation film) TiF is formed in such a manner as to cover the thick insulation film FiF. The thick insulation film FiF is formed of, for example, a silicon oxide film, and has a thickness of, for example, about 1 μm. The planar configuration of the thick insulation film FiF is formed in a frame shape in a plan view in such a manner as to surround the p type semiconductor region FPR as shown in FIG. 6. The p type semiconductor region FPR is formed in a self-alignment manner with the thick insulation film FiF. The outer circumference end of the p type semiconductor region FPR is roughly in agreement with the inner circumference end of the thick insulation film FiF. On the other hand, the thin insulation film TiF is formed of, for example, the same silicon oxide film as that of the thick insulation film FiF, but is thinner than the thick insulation film FiF. The thickness thereof is, for example, about 0.2 μm. The thin insulation film TiF is formed in such a manner as to cover almost the entire region of the first surface of the substrate SB (including the thick insulation film FiF).

Further, as shown in FIG. 5, over the thick insulation film FiF and the thin insulation film TiF, the resistive field plate part FP is formed. The resistive field plate part FP is a structure for ensuring the breakdown voltage of the peripheral region PR of the chip CP during the OFF state of the power transistor, and is arranged in the peripheral region PR (see FIG. 2) while being electrically coupled between the collector and emitter of the power transistor.

The resistive field plate part FP has, as shown in FIGS. 4, 5, 7, and 8, an inner conductor pattern (first conductor pattern) FCP, the outer conductor pattern (second conductor pattern) SCP, and an intermediate conductor pattern (third conductor pattern) TCP for electrically coupling these in an integral form. The conductor patterns FCP, SCP, and TCP are each formed of, for example, polysilicon, and each have a thickness of, for example, about 500 to 600 nm. The conductor patterns FCP, SCP, and TCP contains an impurity with a prescribed density so as to achieve a prescribed resistance value.

The inner conductor pattern FCP is, as shown in FIG. 7, formed in a frame shape in a plan view in such a manner as to surround the element region DR. Further, the inner conductor pattern FCP has a main part FCP1 and a lead-out part (first extension part) FCP2 in an integral form as shown in FIGS. 5 8. The main part FCP1 of the conductor pattern FCP is formed over the thick insulation film FiF. On the other hand, the lead-out part FCP2 of the conductor pattern FCP extends inwardly from the inner circumference end of the thick insulation film FiF, and is formed over the thin insulation film TiF in a cross sectional view.

The outer conductor pattern SCP is formed in a frame shape in a plan view in such a manner as to surround the inner conductor pattern FCP as shown in FIG. 7. Further, the outer conductor pattern SCP has, as shown in FIGS. 5 and 8, a main part SCP1, a lead-out part (second extension part) SCP2 in an integral form. The main part SCP1 of the conductor pattern SCP is formed over the thick insulation film FiF. On the other hand, the lead-out part SCP2 of the conductor pattern SCP extends outwardly from the outer circumference end of the thick insulation film FiF, and is formed over the thin insulation film TiF in a cross sectional view.

The intermediate conductor pattern TCP is formed between the inner and outer conductor patterns FCP and SCP, and over the thick insulation film FiF in a cross sectional view as shown in FIGS. 4, 5, 7, and 8. Further, the intermediate conductor pattern TCP is formed, for example, in a spiral shape in a plan view as shown in FIG. 7. On end of the conductor pattern TCP is coupled with the inner conductor pattern FCP, and the other end of the conductor pattern TCP is coupled with the outer conductor pattern SCP.

A current of the order of several microangstroms is passed through such conductor patterns FCP, TCP, and SCP of the resistive field plate part FP from the collector toward the emitter. Then, the electric potential is divided by the conductor patterns FCP, TCP, and SCP, and a field plate having a given electric potential is formed in the peripheral region PR. Then, the electric potential distribution unifies the electric field distribution inside the substrate SB in the peripheral region PR, and the electric potential of the upper surface of the substrate SB is fixed. As a result, the breakdown voltage of the peripheral region PR of the chip CP increases, so that the reliability is ensured. Further, with a peripheral structure using the resistive field plate part FP, the current passing through the conductor patterns FCP, SCP, and TCP fixes the electric potential distribution between collector and emitter. For this reason, the structure is less likely to be affected by the external electric charge, and becomes a tough structure. Further, the line/space of the conductor patterns FCP, SCP, and TCP of the resistive field plate part FP is miniaturized. As a result, the electric field strength of the first surface of the substrate SB can be unified, and the breakdown voltage can be ensured even with a short perimeter. For this reason, the structure is effective in terms of the breakdown voltage, the cost, and the reliability.

As shown in FIG. 5, the insulation film iF is deposited over the first surface of such a substrate SB in such a manner as to cover the resistive field plate part FP (conductor patterns FCP, SCP, and TCP), the thin insulation film TiF, and the like. Then, over the insulation film iF, the internal circulation wire FCW and the external circulation wire SCW are formed. The internal circulation wire FCW and the external circulation wire SCW are formed of a lamination film of a barrier conductor film BCF and a main conductor film MCF deposited thereover as with the emitter electrode EE as described above.

The internal circulation wire FCW is electrically coupled with a p type semiconductor region FPR through a coupling hole (third coupling hole) JH1 perforated in the insulation film iF and the thin insulation film TiF. A $p^+$ type semiconductor region JPR3 is formed at the top of the p type semiconductor region FPR at the bottom of the coupling hole JH1, and an ohmic contact with the internal circulation wire FCW is ensured.

Further, the internal circulation wire FCW is electrically coupled with the lead-out part FCP2 of the conductor pattern FCP of the resistive field plate part FP through the coupling hole (first coupling hole) JH2 perforated in the insulation film iF. That is, in the present First Embodiment, the coupling hole JH2 is arranged at the lead-out part FCP2 over the thin insulation film TiF inside the inner circumference end of the thick insulation film FiF. Accordingly, the height from the first surface of the substrate SB to the bottom surface of the coupling hole JH2 is lower than the upper surface height of the insulation film FiF. This does not cause much difference in the upper surface of the insulation film iF between at the position of the coupling hole JH1 and at the position of the coupling hole JH2. A $p^+$ type semiconductor region JPR4 is formed at the top of the lead-out part FCP2 at the bottom of the coupling hole JH2, and an ohmic contact with the internal circulation wire FCW is ensured. Further, the coupling hole JH2 is formed in such a manner as to make a round without interruption along the outer circumference of the internal circulation wire FCW in a plan view as shown in FIG. 9. Incidentally, although not shown, the planar configuration of the coupling hole JH1 is also the same as that of the coupling hole JH2. Further, a plurality of coupling holes JH1 and JH2 may be arranged along the outer circumference of the internal circulation wire FCW.

On the other hand, as shown in FIG. 5, the external circulation wire SCW is electrically coupled with the $p^+$ type semiconductor region JPR5 and the $n^+$ type channel stopper region CSR through the coupling hole JH3 perforated in the insulation film iF and the thin insulation film TiF. The $p^+$ type semiconductor region JPR5 ensures an ohmic contact with the external circulation wire SCW. Then, the external circulation wire SCW is electrically coupled with the collector region CR at the second surface of the substrate SB through the coupling hole JH3 and the $p^+$ type semiconductor region JPR5.

Further, the external circulation wire SCW is electrically coupled with the lead-out part SCP2 of the conductor pattern SCP of the resistive field plate part FP through the coupling hole (second coupling hole) JH4 perforated in the insulation film iF. That is, in the present First Embodiment, the coupling hole JH4 is arranged at the lead-out part SCP2 over the thin insulation film TiF outside the outer circumference end of the thick insulation film FiF. Accordingly, the height from the first surface of the substrate SB to the bottom surface of the coupling hole JH4 is lower than the upper surface height of the insulation film FiF. This does not cause much difference in the upper surface of the insulation film iF between at the position of the coupling hole JH3 and at the position of the coupling hole JH4. A $p^+$ type semiconductor region JPR6 is formed at the top of the lead-out part SCP2 at the bottom of the coupling hole JH4, and an ohmic contact with the external circulation wire SCW is ensured. Further, the coupling hole JH4 is formed in such a manner as to make a round without interruption along the inner circumference of the external circulation wire SCW as shown in FIG. 9. Incidentally, although not shown, the planar configuration of the coupling hole JH3 is also the same as that of the coupling hole JH4. Further, a plurality of coupling holes JH3 and JH4 may be arranged along the outer circumference of the external circulation wire SCW.

Thus, in the present First Embodiment, even when the thick insulation film FiF and the insulation film iF are increased in thickness for ensuring the reliability, much difference is not caused in the upper surface height of the insulation film iF between at the position of the coupling hole JH1 for coupling the internal circulation wire FCW and the p type semiconductor region FPR and at the position of the coupling hole JH2 for coupling the internal circulation wire FCW and the resistive field plate part FP. Further, much difference is not caused in the upper surface height of the insulation film iF between at the position of the coupling hole JH3 for coupling the external circulation wire SCW and the p type semiconductor region JPR5 and at the position of the coupling hole JH4 for coupling the external circulation wire SCW and the resistive field plate part FP. For this reason, when the coupling holes JH1 to JH4 are formed by the same photolithography step (the same mask), the problem of defocus can be avoided. That is, the coupling holes JH1 to JH4 can be formed by the same photolithography step (the same mask) without causing defective shapes or dimensions (diameters). For this reason, the yield and the reliability of the semiconductor device can be improved. Furthermore, the process can be facilitated, and still further, the mask and the process can be shared, and hence the process cost can be reduced.

Still further, the present embodiment is also adaptable to miniaturization of the coupling hole of the transistor cell in the element region DR (see FIG. 2). That is, the coupling hole in the element region DR, and the coupling hole in the peripheral region PR (see FIG. 2) can be formed by the same photolithography step (the same mask) without causing defective shapes or dimensions (diameters). For this reason, the performances, yield, and reliability of the semiconductor device can be improved. Further, in terms of the relationship between the element region and the peripheral region, the process can be facilitated, and still further, the mask and the process can be shared, and hence the process cost can be reduced.

Further, in the present First Embodiment, as shown in FIGS. 1, 4, and 5, the outer circumference end of the internal circulation wire FCW is not in agreement with the outer circumference end of the inner conductor pattern FCP, and is separated from the outer circumference end of the conductor pattern FCP by a distance Lx toward the element region DR (see FIG. 2). Incidentally, for this reason, the internal circulation wire FCW of the present First Embodiment does not function as the resistive field plate part FP.

Further, the inner circumference end of the external circulation wire SCW is not in agreement with the inner circumference end of the outer conductor pattern SCP, and is separated from the inner circumference end of the conductor pattern SCP by the distance Lx toward the outer circumference of the chip CP. Incidentally, for this reason, the external circulation wire SCW of the present First Embodiment does not function as the resistive field plate part FP.

Figure 10:
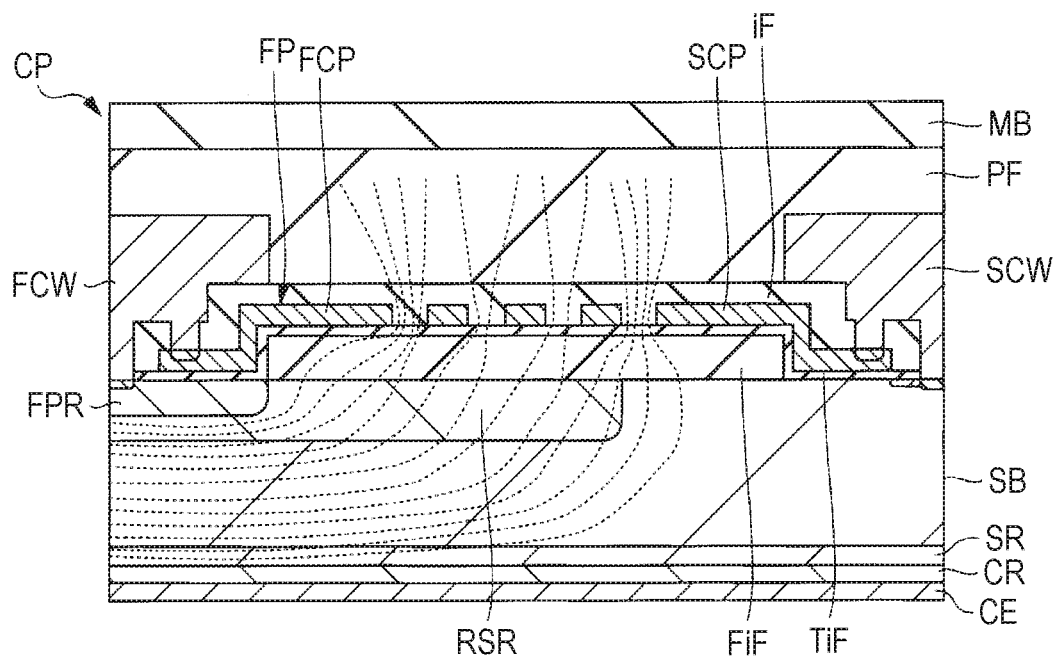
FIG. 10 is an essential part cross sectional view of the chip schematically showing the state of the equipotential line (electric field strength) in the peripheral region of the semiconductor device of First Embodiment.

Herein, FIG. 10 is an essential part cross sectional view of the chip schematically showing the state of the equipotential line (electric field strength) in the peripheral region of the semiconductor device of the present First Embodiment. Broken lines show equipotential lines, and a region with a high density of equipotential lines is a high electric field region. The electric potential of the first surface of the chip CP is unified by the resistive field plate part FP, but, actually, is affected by the impurity density of the resurf region RSR at the first surface of the substrate SB, not resulting in a fully uniform electric field distribution. Thus, a higher electric field is achieved on the p type semiconductor region FPR side and on the outermost circumference side.

In the present First Embodiment, as described above, the outer circumference end of the internal circulation wire FCW is separated from the outer circumference end of the inner conductor pattern FCP toward the element region DR. Further, the inner circumference end of the external circulation wire SCW is separated from the inner circumference end of the outer conductor pattern SCP toward the outer circumference of the chip CP. As a result, as shown in FIG. 10, the outer circumference end of the internal circulation wire FCW and the inner circumference end of the external circulation wire SCW can be made distant from the high electric field region. For this reason, the electric field at the outer circumference end of the internal circulation wire FCW and the inner circumference end of the external circulation wire SCW can be relaxed. Accordingly, the moisture resistance tolerance of the internal circulation wire FCW or the external circulation wire SCW can be improved. Therefore, it is possible to suppress the deficiency that the internal circulation wire FCW and the external circulation wire SCW are corroded under the influence of a high electric field during a moisture resistance test. Further, for this reason, a hard passivation film such as a silicon nitride film may not be provided in the surface protective film PF. In this case, the process of the semiconductor device can be facilitated, and hence the process cost can be reduced.

Figure 11:
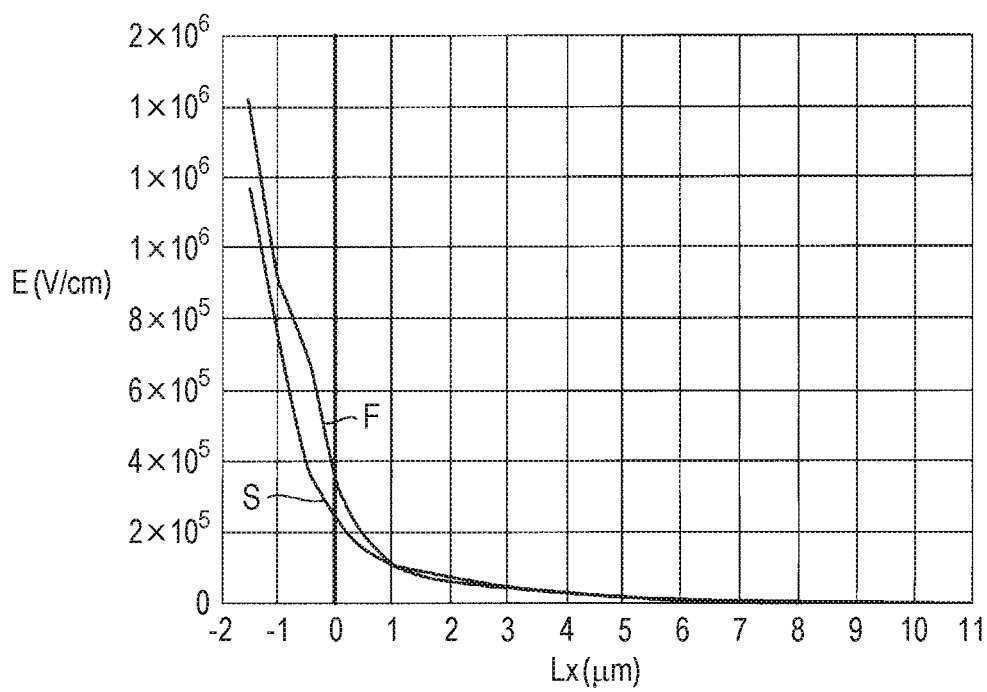
FIG. 11 is a graph diagram showing the relationship between the distance from the end of the resistive field plate part to each end of the internal circulation wire and the external circulation wire, and the maximum electric field strength.

Further, FIG. 11 is a graph diagram showing the relationship between the distance from the end of the resistive field plate part to each end of the internal circulation wire and the external circulation wire, and the maximum electric field strength. The horizontal axis shows a distance Lx, and the vertical axis shows the maximum electric field strength E of each end of the internal circulation wire and the external circulation wire. A reference sign F indicates the result of the internal circulation wire, and S indicates the result of the external circulation wire.

Further, the state in which each position of the outer circumference end of the internal circulation wire and the inner circumference end of the external circulation wire is in agreement with the end of the resistive field plate part FP is referred to as "0". Furthermore, for the internal circulation wire, the case where the outer circumference end of the internal circulation wire is retreated to the element region side is referred to as "positive", and the case where the outer circumference end of the internal circulation wire is extended to the outer circumference side of the chip is referred to as "negative". Whereas, for the external circulation wire, the case where the inner circumference end of the external circulation wire is retreated to the outer circumference side of the chip is referred to as "positive", and the case where the inner circumference end of the external circulation wire is extended to the element region side is referred to as "negative".

When the internal circulation wire is extended to the outer circumference side of the chip, or when the external circulation wire is extended to the element region side (in either case, "negative" side), a still higher electric field is achieved, resulting in the reduction of the moisture resistance tolerance of the internal circulation wire or the external circulation wire (i.e., the internal circulation wire and the external circulation wire become more likely to be corroded).

On the other hand, by setting the distance Lx between the outer circumference end of the internal circulation wire and the outer circumference end of the inner conductor pattern, or the distance Lx between the inner circumference end of the external circulation wire and the inner circumference end of the outer conductor pattern at 1 μm or more, preferably 3 μm or more, and most preferably about 4 to 5 μm, the electric field can be relaxed. Particularly, by setting the distance Lx at 4 to 5 μm, the effect of the electric field relaxation is saturated. For this reason, the moisture resistance tolerance of the internal circulation wire or the external circulation wire can be improved. That is, the corrosion of the internal circulation wire and the external circulation wire can be suppressed.

When each distance Lx is set at 1 μm or more, preferably 3 μm or more, and most preferably about 4 to 5 μm as described above, a sufficient effect on the electric field relaxation can be obtained. However, more preferably, as shown in FIG. 5, the outer circumference end of the internal circulation wire FCW is arranged inside the inner circumference end of the thick insulation film FiF, and the outer circumference end of the external circulation wire SCW is arranged outside the outer circumference end of the thick insulation film FiF. This is due to the following: the thick insulation film FiF is formed at a position with a high electric field strength, and hence, outside the range, the electric field strength becomes relatively lower. That is, the outer circumference end of the internal circulation wire FCW and the inner circumference end of the external circulation wire SCW are arranged outside the range of the thick insulation film FiF. As a result, the electric field strength to be applied to respective ends can be reduced. Accordingly, it is possible to more improve the moisture resistance tolerance of the internal circulation wire FCW or the external circulation wire SCW. Particularly, the outer circumference end of the internal circulation wire FCW is arranged inside the outer circumference end of the p type semiconductor region FPR fixed to an electric potential of 0 V. This can make the internal circulation wire FCW less likely to be affected by the electric field. For this reason, it is possible to still more improve the moisture resistance tolerance of the internal circulation wire FCW.

However, the distance Lx between the outer circumference end of the internal circulation wire and the outer circumference end of the inner conductor pattern may be equal to the distance Lx between the inner circumference end of the external circulation wire and the inner circumference end of the outer conductor pattern. However, the present invention is not limited thereto. The distance may be changed according to respective electric field strengths.

As shown in FIG. 5, the internal circulation wire FCW and the external circulation wire SCW as described above are covered with the surface protective film PF. Further, over the surface protective film PF, a part of the sealing body MB forming the package is shown. Incidentally, for example, the two semiconductor devices of the present First Embodiment can be coupled in series to form an inverter circuit, thereby to form a power module in which one is a high-side semiconductor device, and the other is a low-side semiconductor device. In this case, a diode is electrically coupled in anti-parallel with each semiconductor device according to the applicable product. Then, the semiconductor device and the diode are sealed in one sealing body. As a result, the power module can be reduced in size.

Manufacturing Method Example of Semiconductor Device

Then, one example of a method for manufacturing a semiconductor device of the present First Embodiment will be described by reference to FIGS. 12 to 19. FIGS. 12 to 19 are each an essential part cross sectional view of the element region (left) and the peripheral region (right) of a substrate of the semiconductor device of FIG. 1 during a manufacturing step.

A substrate SB at the stage shown in FIG. 12 is a semiconductor wafer in a substantially circular shape in a plan view. For the substrate SB, a semiconductor wafer or an epitaxial wafer formed by, for example, the Cz (Czochralski) method, the MCz (Magnetic field applied Czochralski) method, or the FZ (Floating Zone) method is used. However, for example, for high breakdown voltage use of a breakdown voltage class of 600 V or more, a substrate formed using the FZ method is preferable. The impurity density in the crystal of the substrate SB can be selected according to each breakdown voltage, and is preferably within the range of, for example, $3.29 \times 10^{13}/cm^3$ (equivalent to 140 Ωcm) to $4.66 \times 10^{14}/cm^3$ (equivalent to 10 Ωcm).

Over a first surface of the substrate SB, for example, an insulation film formed of a silicon oxide film is formed. Then, the insulation film is patterned by a photolithography method and an etching method. As a result, a pattern of the thick insulation film FiF is formed over the first surface of the substrate SB in the peripheral region PR.

Subsequently, after removing a resist mask for forming the pattern of the thick insulation film FiF, a resist mask (not shown) is formed over the first surface of the substrate SB by a photolithography method. Using the resist mask as an ion implantation mask, for example, boron is ion implanted into the first surface of the substrate SB. As a result, at the first surface of the substrate SB in the peripheral region PR, a p⁻ type resurf region RSR is formed. The impurity density of the resurf region RSR is preferably, for example, within the range of $1 \times 10^{15}$ to $1 \times 10^{17}/cm^3$.

Then, after removing resist mask for forming the resurf region, over the first surface of the substrate SB, a resist mask (not shown) is formed by a photolithography method. Using the resist mask and the thick insulation film FiF as a mask, for example, boron is ion implanted into the first surface of the substrate SB. As a result, at the first surface of the substrate SB in the peripheral region PR, a p type semiconductor region FPR is formed in self-alignment with the inner circumference end of the thick insulation film FiF. Then, after removing the resist mask for forming the p type semiconductor region FPR, the substrate SB is subjected to an annealing treatment for activating the impurity in the resurf region RSR and the p type semiconductor region FPR.

Figure 13:
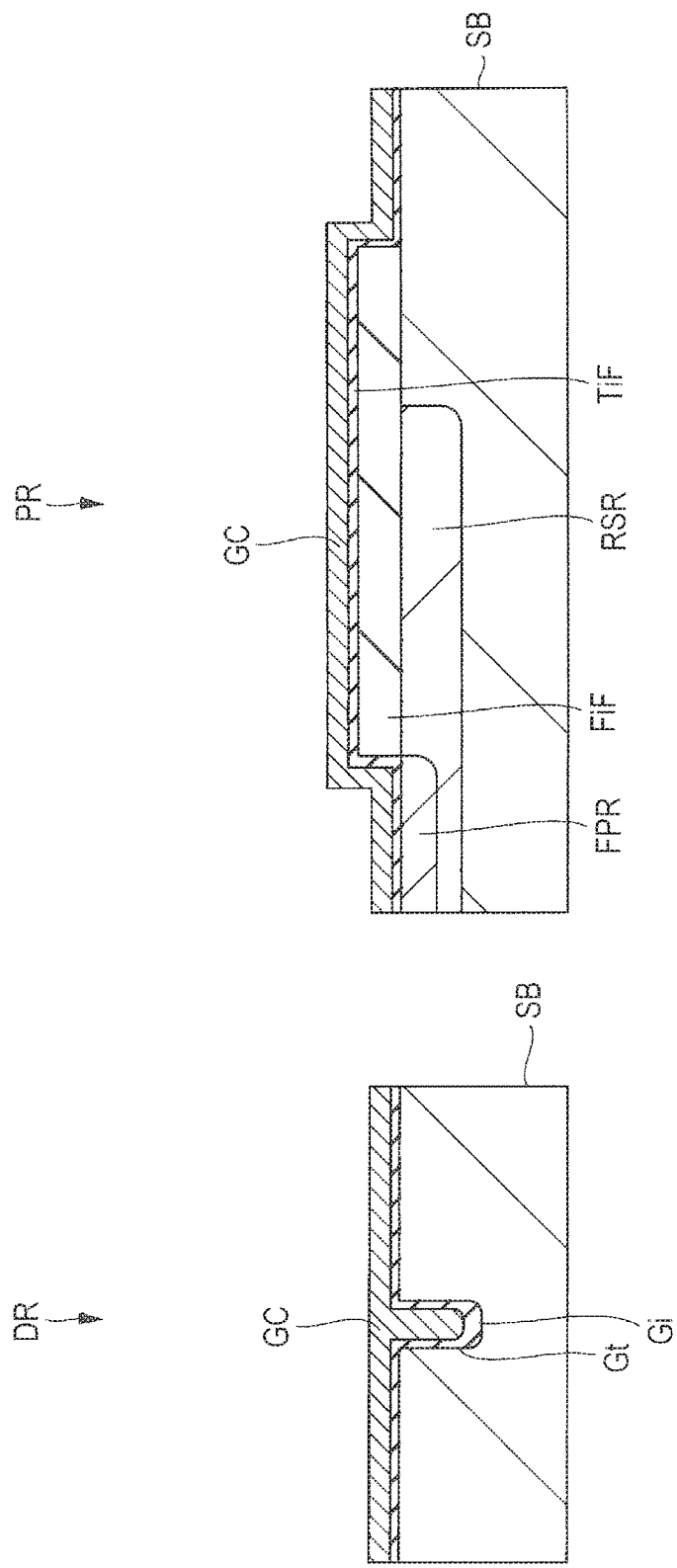
FIG. 13 is an essential part cross sectional view of the element region (left) and the peripheral region (right) of the semiconductor substrate of the semiconductor device during a manufacturing step after the step of FIG. 12.

Then, over the first surface of the substrate SB, an insulation film formed of, for example, a silicon oxide film is deposited. Then, this is patterned by a photolithography method and an etching method, thereby to form a mask pattern for exposing a gate trench formation region. Subsequently, using the mask pattern as an etching mask, the substrate SB exposed therefrom is partially etched, thereby to form a gate trench Gt at the first surface of the substrate SB in the element region DR as shown in FIG. 13. The depth of the gate trench Gt is preferably, for example, within the range of about 2 to 10 μm. Then, the mask pattern for forming gate trench is removed. Incidentally, the planar layout of the gate trench Gt may be, for example, either a normal cell or different interval.

Then, the substrate SB is subjected to a sacrificial oxidation treatment, thereby to form a sacrificial oxidation film over the first surface of the substrate SB (including the inside of the gate trench Gt). Then, the sacrificial oxidation film is removed. Subsequently, the substrate SB is subjected to a gate oxidation treatment, thereby to form a gate insulation film Gi formed of, for example, a silicon oxide film over the first surface of the substrate SB (including the inside of the gate trench Gt). Thereafter, over the first surface of the substrate SB, a conductor film GC formed of, for example, a low resistance polysilicon is deposited by a CVD (Chemical Vapor Deposition) method, or the like.

Figure 14:
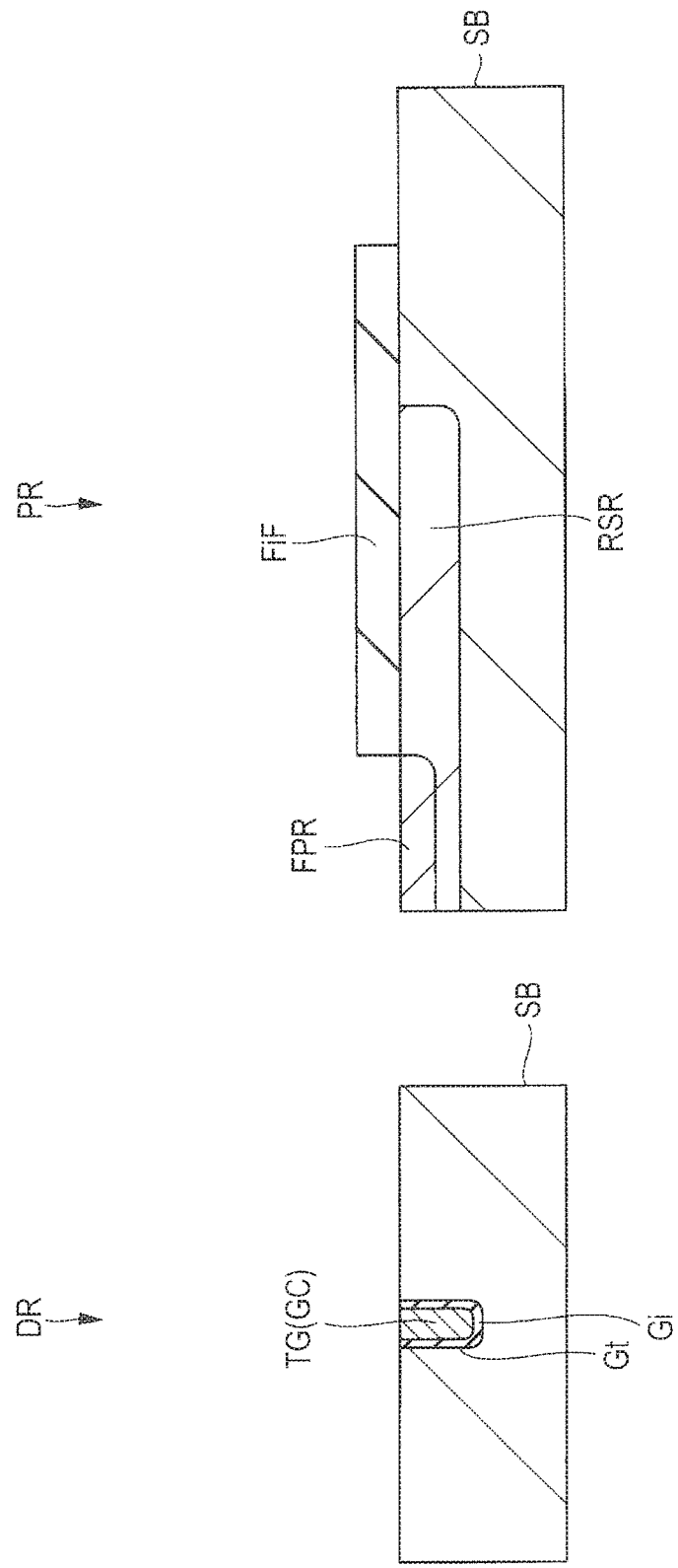
FIG. 14 is an essential part cross sectional view of the element region (left) and the peripheral region (right) of the semiconductor substrate of the semiconductor device during a manufacturing step after the step of FIG. 13.

Then, the conductor film GC and the gate insulation film Gi are sequentially etched back. As a result, as shown in FIG. 14, a trench gate electrode TG (conductor film GC) is formed at the first surface of the substrate SB in the element region DR. The trench gate electrode TG is formed by embedding the conductor film GC in the gate trench Gt formed in the first surface of the substrate SB via the gate insulation film Gi.

Then, as shown in FIG. 15, over the first surface of the substrate SB, a thin insulation film TiF and a polysilicon film PC are sequentially deposited. Then, for example, boron is ion implanted into the polysilicon film PC. The impurity density at this step can be adjusted by the breakdown voltage leakage current within a range such that the polysilicon film PC is not depleted. Subsequently, an annealing treatment is performed, to activate the impurity of the polysilicon film PC. Then, the polysilicon film PC is patterned by a photolithography method and an etching method, to form conductor patterns FCP, SCP, and TCP forming the resistive field plate part FP over the first surface of the substrate SB in the peripheral region PR.

Figure 16:
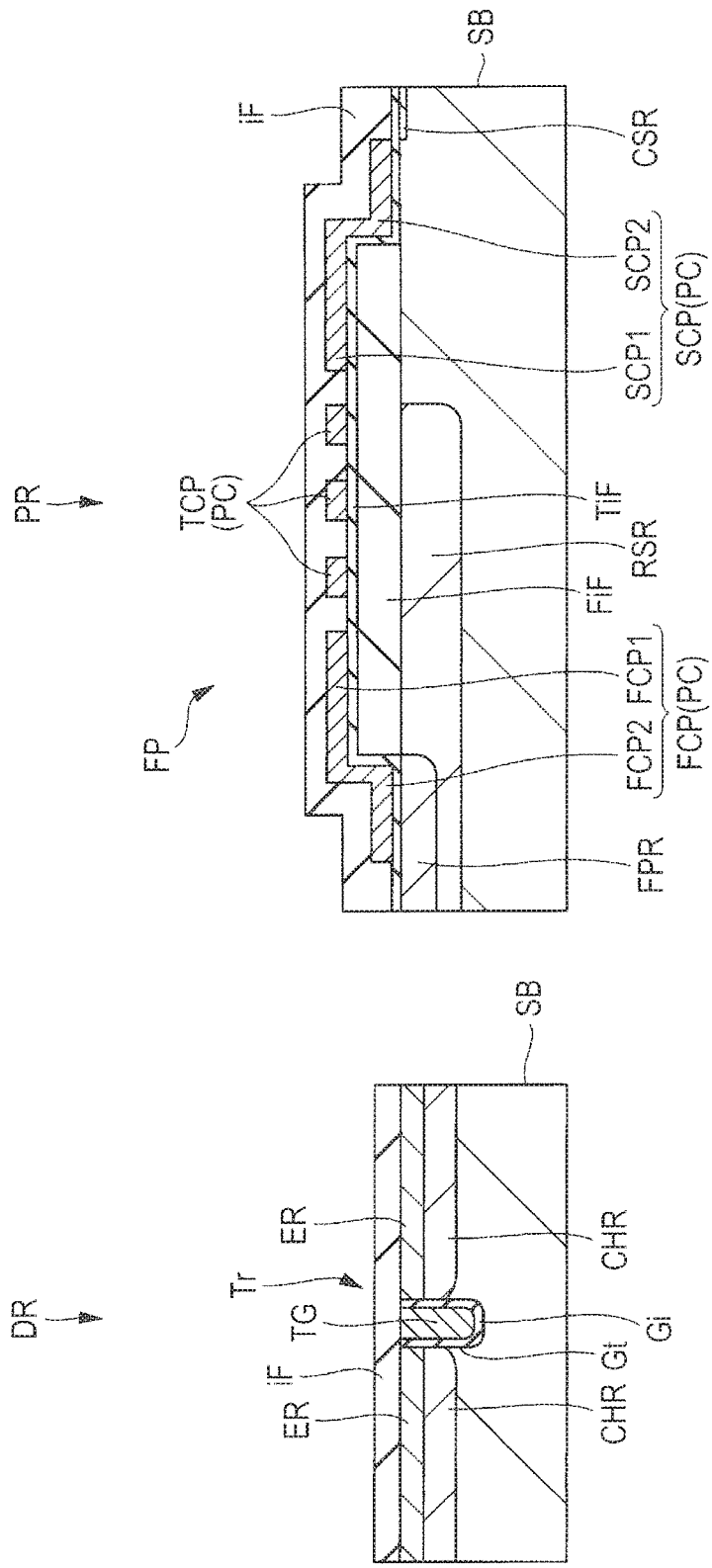
FIG. 16 is an essential part cross sectional view of the element region (left) and the peripheral region (right) of the semiconductor substrate of the semiconductor device during a manufacturing step after the step of FIG. 15.

Then, as shown in FIG. 16, a resist mask for forming channel formation region is formed over the first surface of the substrate SB by a photolithography method. Using the resist mask as an ion implantation mask, for example, boron is ion implanted into the first surface of the substrate SB in the element region DR. As a result, a p type channel formation region CHR is formed at the first surface of the substrate SB in the element region DR.

Subsequently, using the resist mask for channel formation region as an ion implantation mask, for example, phosphorus or arsenic is ion implanted into the first surface of the substrate SB in the element region DR. As a result, an n type emitter region ER is formed at the first surface of the substrate SB in the element region DR.

Then, after removing the resist mask for channel formation region, a resist mask for channel stopper region is formed over the first surface of the substrate SB by a photolithography method. Using the resist mask as an ion implantation mask, for example, phosphorus or arsenic is ion implanted into the first surface of the substrate SB in the peripheral region PR. As a result, a channel stopper region CSR is formed at the first surface of the substrate SB in the peripheral region PR.

Then, after removing the resist film for channel stopper region, over the first surface of the substrate SB, an insulation film iF is deposited in such a manner as to cover the trench gate electrode TG, the resistive field plate part FP (conductor patterns FCP, SCP, and TCP), the thin insulation film TiF, and the thick insulation film FiF by a CVD method or the like. The insulation film iF is formed of, for example, a silicon oxide film. However, a PSG (Phospho Silicate Glass) film, a BPSG (Boro-Phospho Silicate Glass) film, a NSG (Non-doped Silicate Glass) film, a SOG (Spin On Glass) film, and the like may be appropriately combined.

Figure 17:
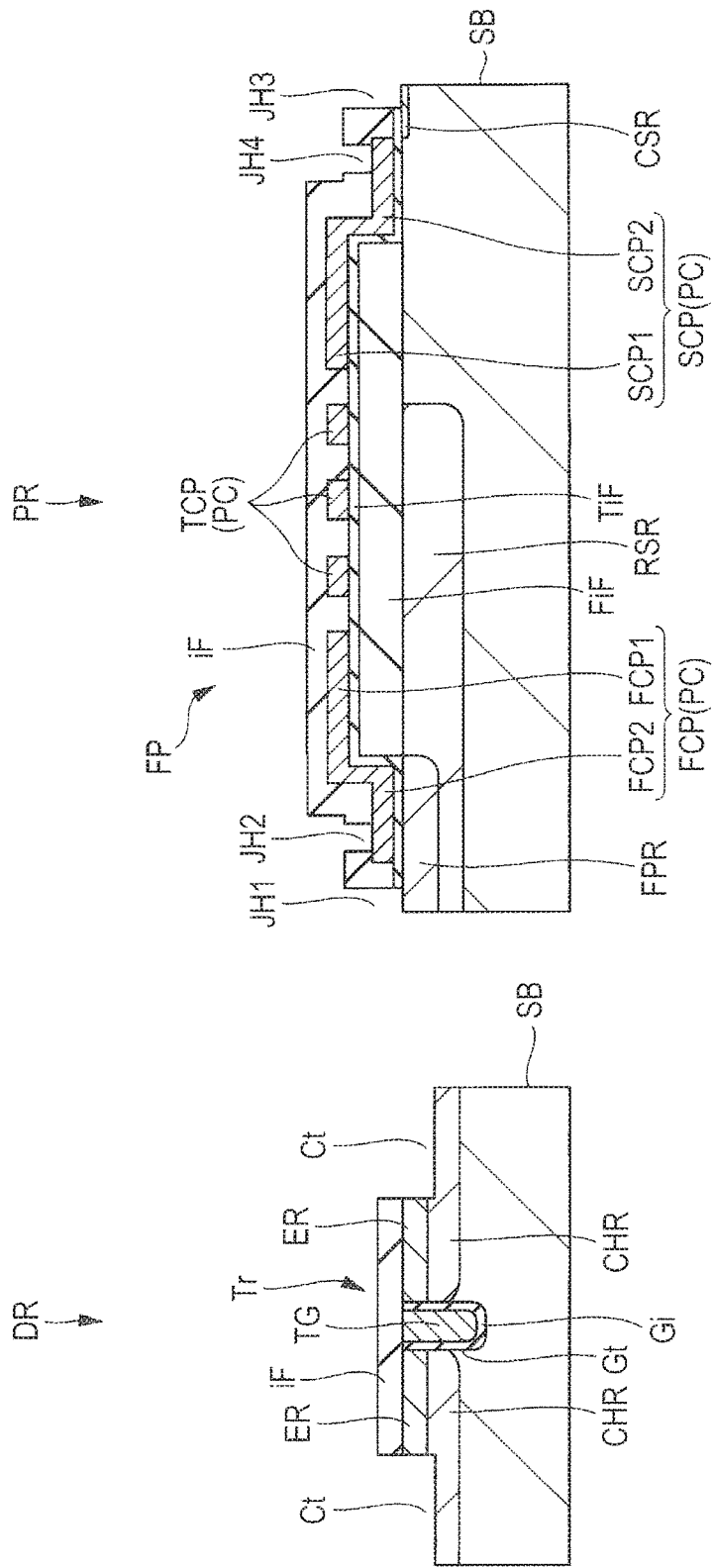
FIG. 17 is an essential part cross sectional view of the element region (left) and the peripheral region (right) of the semiconductor substrate of the semiconductor device during a manufacturing step after the step of FIG. 16.

Then, as shown in FIG. 17, a resist mask for forming coupling hole is formed over the first surface of the substrate SB by a photolithography method. Then, using this as an etching mask, a coupling trench Ct is formed in the first surface of the substrate SB in the element region, and coupling holes JH1 to JH4 are formed in the insulation film iF in the peripheral region PR. At this step, in the present First Embodiment, the coupling trench Ct and the coupling holes JH1 to JH4 can be formed by the same photolithography step (the same mask), and hence the process cost can be reduced.

Figure 18:
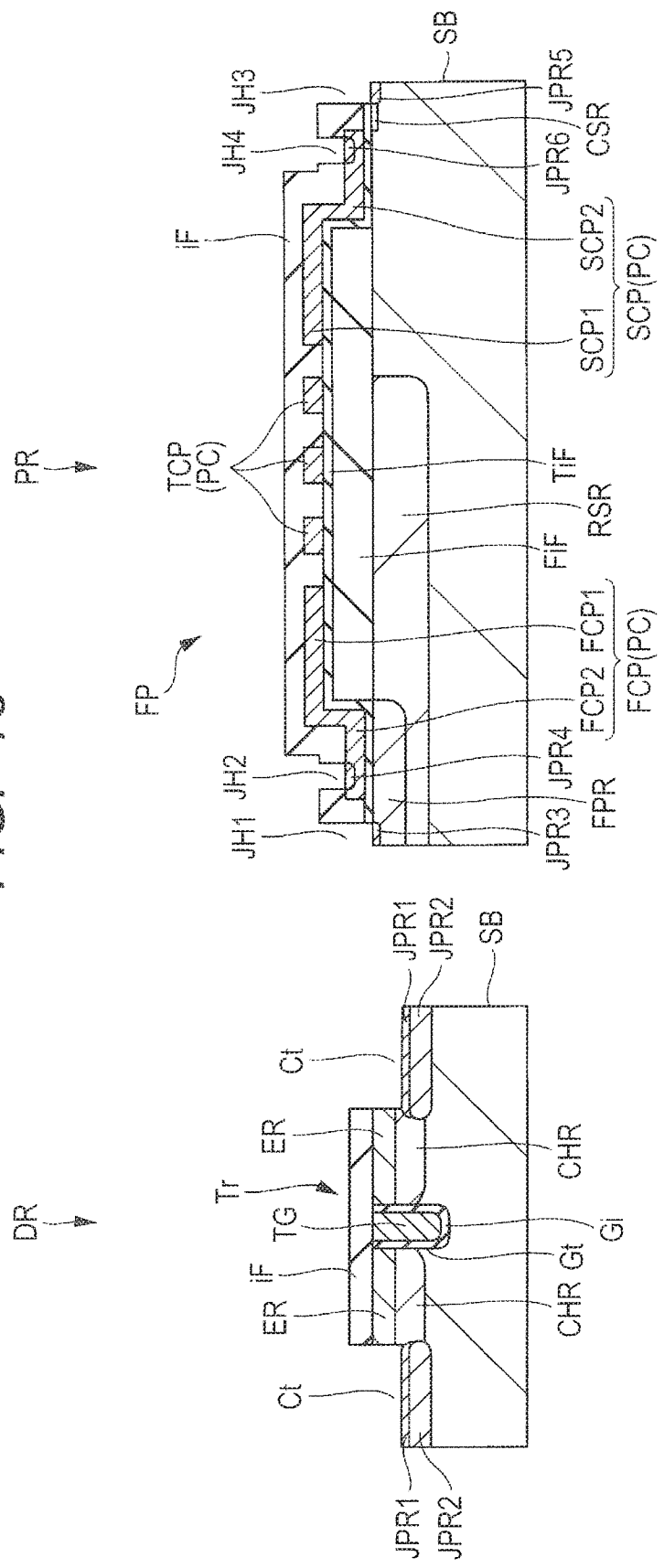
FIG. 18 is an essential part cross sectional view of the element region (left) and the peripheral region (right) of the semiconductor substrate of the semiconductor device during a manufacturing step after the step of FIG. 17.

Subsequently, using the resist mask for forming coupling hole as an ion implantation mask, for example, boron is ion implanted. Then, the resist mask for forming coupling hole is removed. As a result, as shown in FIG. 18, at the bottom of the coupling trench Ct of the substrate SB in the element region DR, p$^+$ type semiconductor regions JPR1 and JPR2 are formed. Simultaneously, at the first surface of the substrate SB at the bottoms of the coupling holes JH1 and JH3 in the peripheral region PR, p$^+$ type semiconductor regions JPR3 and JPR5 are formed. In addition, at the tops of the conductor patterns FCP and SCP at the bottoms of the coupling holes JH2 and JH4, p$^+$ type semiconductor regions JPR4 and JPR6 are formed.

Figure 19:
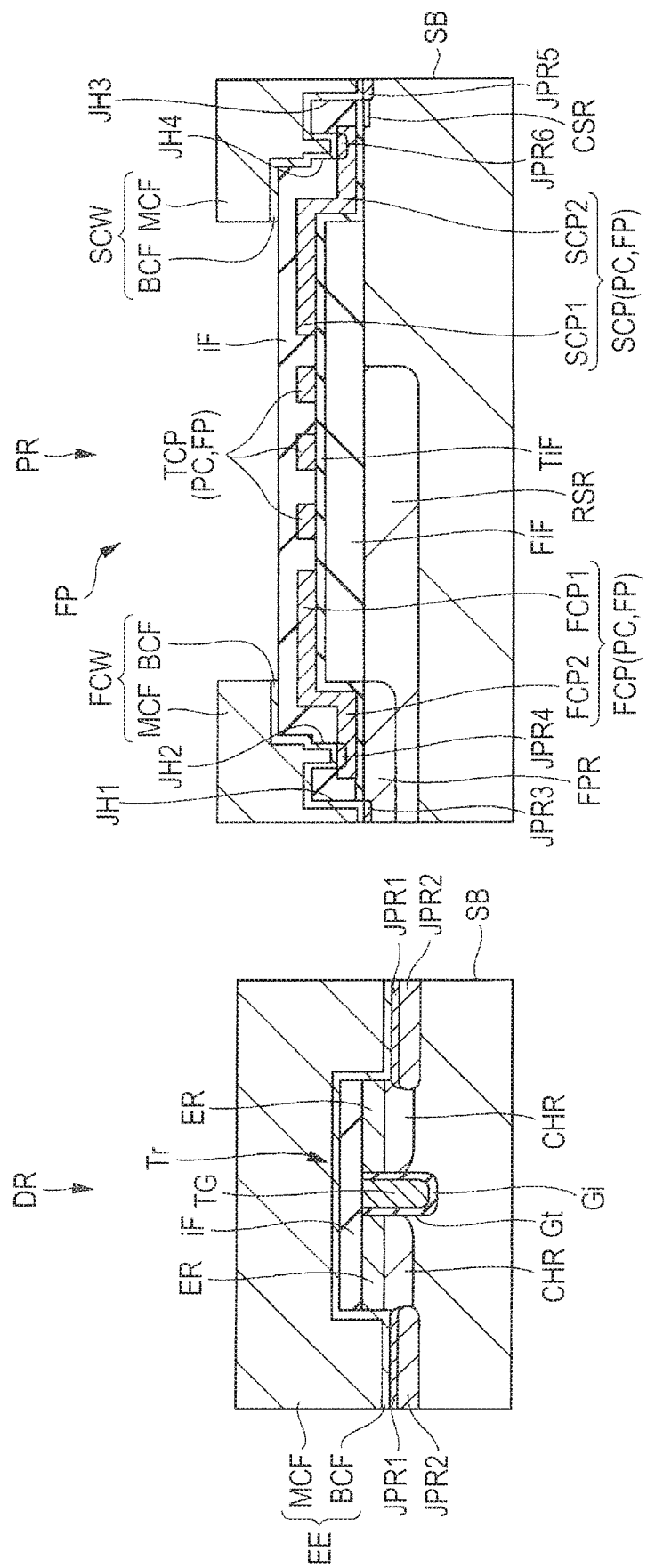
FIG. 19 is an essential part cross sectional view of the element region (left) and the peripheral region (right) of the semiconductor substrate of the semiconductor device during a manufacturing step after the step of FIG. 18.

Then, over the first surface of the substrate SB, a barrier conductor film and a main conductor film are deposited sequentially from the lower layer by a sputtering method or the like. Then, the conductor films are patterned by a photolithography method and an etching method. As a result, as shown in FIG. 19, an emitter electrode EE, an internal circulation wire FCW, and an external circulation wire SCW are formed. At this step, in the present First Embodiment, the outer circumference end of the internal circulation wire FCW is made away from the outer circumference end of the conductor pattern FCP toward the element region DR. Further, the inner circumference end of the external circulation wire SCW is made away from the inner circumference end of the conductor pattern SCP toward the outer circumference of the chip region. Incidentally, after forming the emitter electrode EE, the internal circulation wire FCW, and the external circulation wire SCW, preferably, for example, hydrogen ($H_2$) annealing at 400° C. or more for 30 minutes or more is performed in a hydrogen gas atmosphere. Further, the materials for the barrier conductor film BCF and the main conductor film MCF are the same as those described above.

Then, as shown in FIG. 5, over the first surface of the substrate SB, a surface protective film PF formed of, for example, a polyimide rein is deposited. Subsequently, the back surface of the substrate SB is polished, thereby to reduce the thickness of the substrate SB. With the back surface polishing treatment, the thickness is preferably reduced until the rate is determined by the breakdown voltage. The breakdown voltage also depends upon the crystal density (i.e., the crystal resistivity) and the peripheral structure (edge termination), and hence, structure design in consideration of this is performed. From the viewpoint, the thickness (silicon thickness) of the substrate SB is preferably, for example, within the range of 40 to 200 μm (breakdown voltage class: the case of 600 to 2000 V).

Subsequently, for example, phosphorus is ion implanted into the second surface of the substrate SB, thereby to form a field stop region SR. Further, for example, boron is ion implanted, thereby to form a collector region CR. Then, the second surface of the substrate SB is subjected to a laser annealing treatment or the like, thereby to activate the impurity. Preferably, the impurity density of the field stop region SR is, for example, within the range of $1\times10^{15}$ to $1\times10^{18}/cm^3$, and further, the impurity density of the collector region CR is, for example, within the range of $1\times10^{16}$ to $1\times10^{20}/cm^3$.

Then, for example, Al, Ti, Ni, and Au are sequentially deposited over the second surface of the substrate SB by a sputtering method, thereby to form a collector electrode CE. Then, the substrate SB is diced, and singulated into individual chips CP. Each individual chip CP is mounted over the die pad of a lead frame (not shown), and the die pad and the collector electrode CE of the chip CP are bonded, and are electrically coupled with each other. Further, the lead of the lead frame and the emitter electrode EE and the gate electrode GE of the chip CP are electrically coupled by a bonding wire (not shown), or the like. Then, the chip CP is sealed by a sealing body MB formed of a molding resin or the like, thereby to manufacture a semiconductor device.

Modified Example 1

Common Coupling Hole

Figure 20:
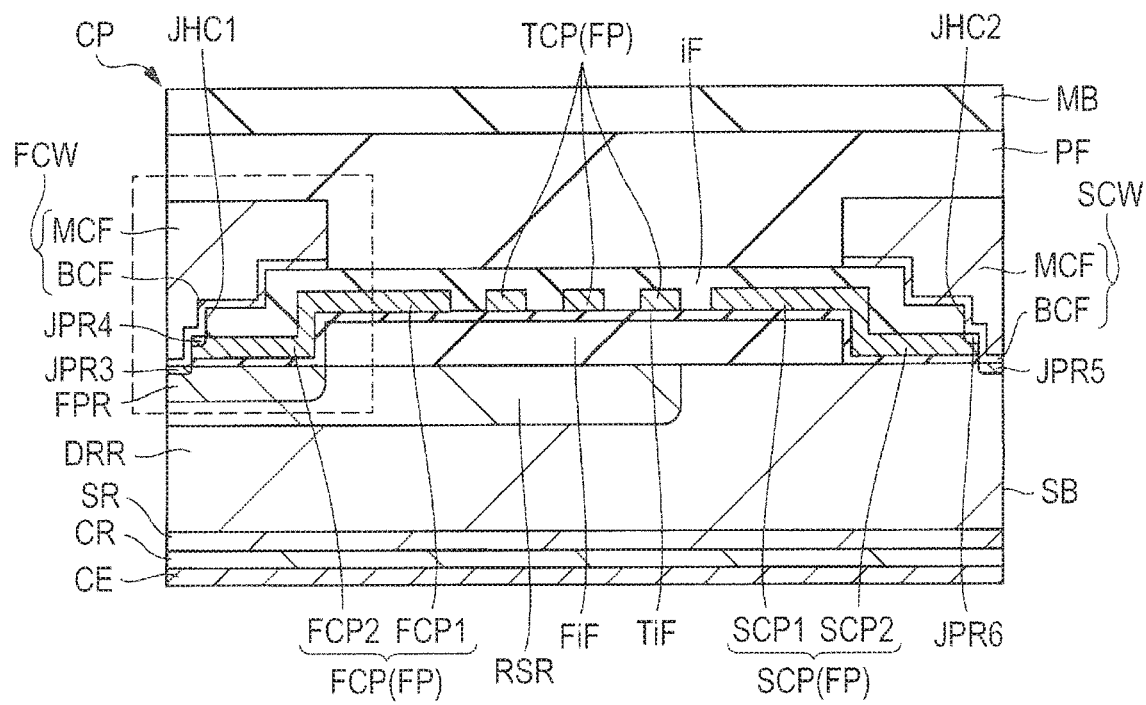
FIG. 20 is a cross sectional view of a part corresponding to line II-II of FIG. 4 in a semiconductor device of Modified Example 1 of First Embodiment.
Figure 21:
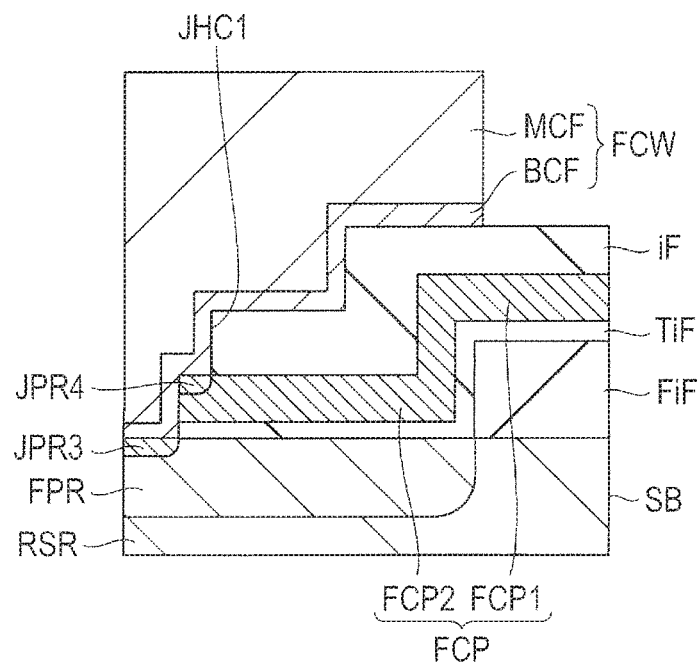
FIG. 21 is an enlarged cross sectional view of a region surrounded by a broken line of FIG. 20.

FIG. 20 is a cross sectional view of a part corresponding to line II-II of FIG. 4 in a semiconductor device of Modified Example 1 of First Embodiment; and FIG. 21 is an enlarged cross sectional view of a region surrounded by a broken line of FIG. 20.

In Modified Example 1, as shown in FIGS. 20 and 21, the internal circulation wire FCW is electrically coupled with both of the p type semiconductor region FPR and the resistive field plate part FP through the common coupling hole (first common coupling hole) JHC1 perforated in the insulation film iF. The common coupling hole JHC1 is arranged in such a manner as to internally include apart of the p type semiconductor region FPR, and a part (inner circumference end) of the lead-out part FCP2 of the inner conductor pattern FOP. The internal circulation wire FCW is in contact with, and is electrically coupled with the p+ type semiconductor region JPR3 of the p type semiconductor region FPR and the p+ type semiconductor region JPR4 of the lead-out part FCP2 exposed from the common coupling hole JHC1.

Further, in Modified Example 1, the external circulation wire SCW is electrically coupled with both of the p+ type semiconductor region JPR5 and the resistive field plate part FP through the common coupling hole (second common coupling hole) JHC2 perforated in the insulation film iF. The common coupling hole JHC2 is arranged in such a manner as to internally include the p+ type semiconductor region JPR5 and a part (outer circumference end) of the lead-out part SCP2 of the outer conductor pattern SCP. The external circulation wire SCW is in contact with, and is electrically coupled with the p+ type semiconductor region (second semiconductor region) JPR5 and the p+ type semiconductor region JPR6 of the lead-out part SCP2 exposed from the common coupling hole JHC2. Incidentally, the common coupling holes JHC1 and JHC2 are formed by the same photolithography step (i.e., the same mask).

In such Modified Example 1, the size of the peripheral region can be reduced than in the case of the First Embodiment, and hence, the chip size can be reduced. Therefore, the cost of the semiconductor device can be reduced.

Further, even though the chip size is not increased, the distance LX between the outer circumference end of the internal circulation wire FCW and the outer circumference end of the inner conductor pattern FCP, and the distance LX between the inner circumference end of the external circulation wire SCW and the inner circumference end of the outer conductor pattern SCP can be set longer than in the case of the First Embodiment.

Modified Example 2

Modified Example of Layout of Coupling Hole

Figure 22:
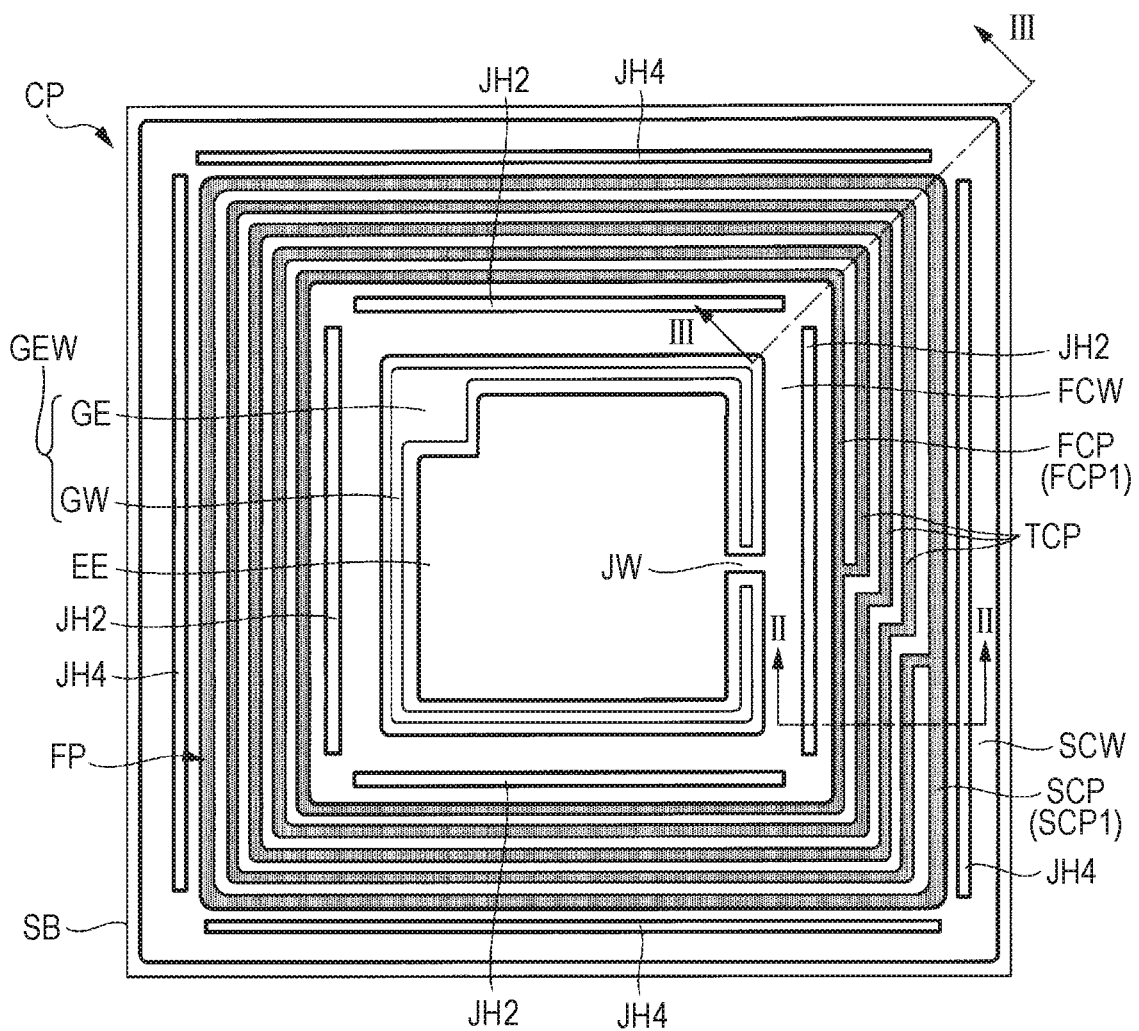
FIG. 22 is a plan view of a chip forming a semiconductor device of Modified Example 2 of First Embodiment.
Figure 23:
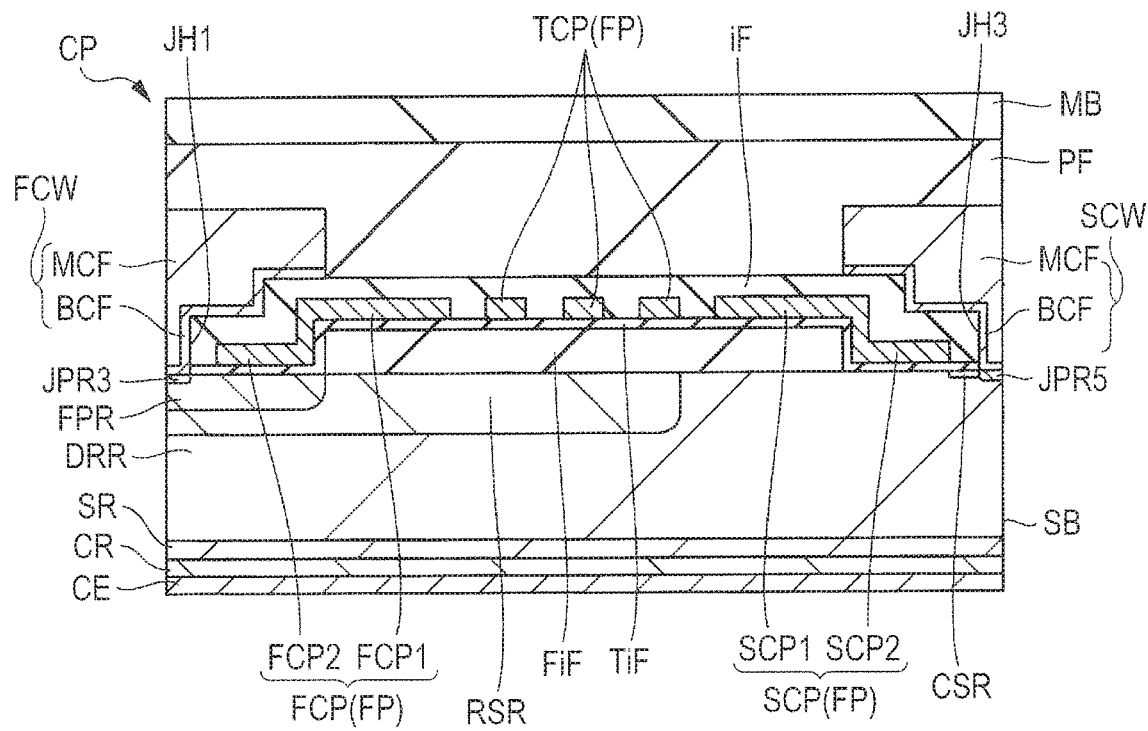
FIG. 23 is a cross sectional view along line III-III of FIG. 22.
Figure 24:
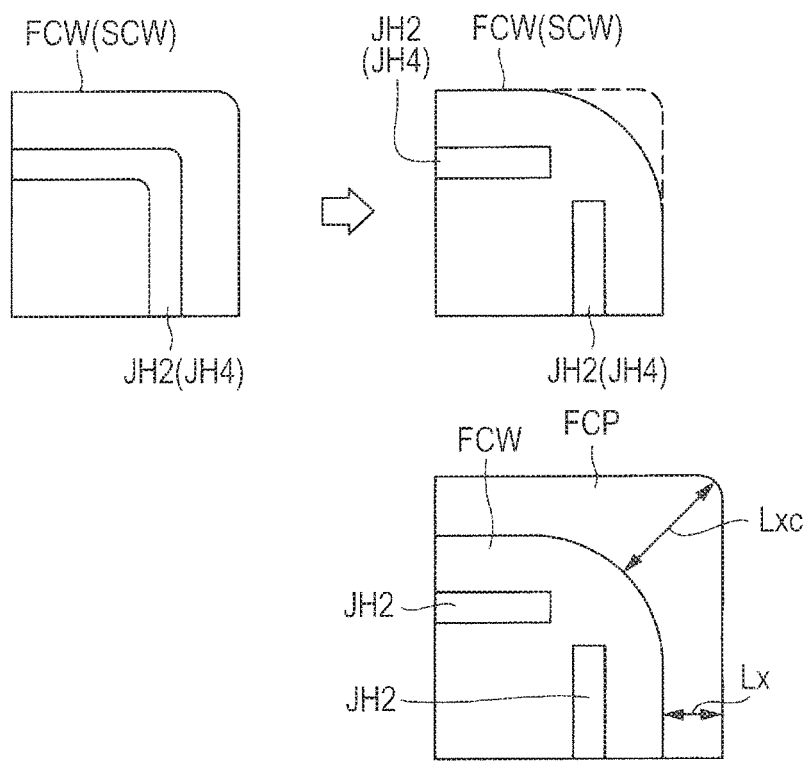
FIG. 24 is an essential part plan view of a peripheral region of the semiconductor chip.

FIG. 22 is a plan view of a chip forming a semiconductor device of Modified Example 2 of First Embodiment; FIG. 23 is a cross sectional view along line III-III of FIG. 22; and FIG. 24 is an essential part plan view of the peripheral region of the chip. Incidentally, the cross sectional view along line II-II of FIG. 22 is the same as that of FIG. 5.

In Modified Example 2, as shown in FIGS. 22 and 23, the coupling hole JH2 for coupling the internal circulation wire FCW and the inner conductor pattern FCP (lead-out part FCP2) is not arranged at the corner part of the internal circulation wire FCW in a pan view, and is arranged in a state extending between the corner part and the corner part. That is, the coupling hole JH2 is arranged only along the side of the emitter electrode EE.

Further, in Modified Example 2, the coupling hole JH4 for coupling the external circulation wire SCW and the outer conductor pattern SCP (lead-out part SCP2) is not arranged at each corner part of the external circulation wire SCW in a plan view, and is arranged in a state extending between the corner part and the corner part. That is, the coupling hole JH4 is arranged only along each side of the emitter electrode EE.

This can relax the concentration of the electric field to each corner part of the internal circulation wire FCW and the external circulation wire SCW. For this reason, it is possible to suppress the corrosion of the internal circulation wire FCW and the external circulation wire SCW, and the oxidation of the resistive field plate part FP.

Further, the left of FIG. 24 shows the corner part of the internal circulation wire FCW and the external circulation wire SCW in the case of the First Embodiment. In the case of the First Embodiment, the coupling holes JH2 and JH4 are arranged at the corner parts of the internal circulation wire FCW and the external circulation wire SCW. This imposes a restriction on the increase in radius of curvature of each outer circumference corner part of the internal circulation wire FCW and the external circulation wire SCW.

In contrast, as shown in the upper right of FIG. 24, in Modified Example 2, the coupling holes JH2 and JH4 are not present at each corner part of the internal circulation wire FCW and the external circulation wire SCW. For this reason, it is possible to increase the radius of curvature of each outer circumference corner part of the internal circulation wire FCW and the external circulation wire SCW. As a result, it is possible to more relax the concentration of the electric field to each corner part of the internal circulation wire FCW and the external circulation wire SCW. Therefore, it is possible to further suppress the corrosion of the internal circulation wire FCW and the external circulation wire SCW, and the oxidation of the resistive field plate part FP.

Further, in Modified Example 2, as shown in the lower right of FIG. 24, the radius of curvature of the outer circumference corner part of the internal circulation wire FCW is increased. As a result, the distance Lxc between the outer circumference end of the outer circumference corner part of the internal circulation wire FCW, and the outer circumference end of the inner conductor pattern FCP can be set relatively larger. For this reason, it is possible to further relax the concentration of the electric field to the outer circumference corner part of the internal circulation wire FCW. Accordingly, it is possible to further suppress the corrosion of the corner part of the internal circulation wire FCW, and the oxidation of the corner part of the resistive field plate part FP.

Other configurations than these are the same as in the First Embodiment. Further, also in the case of Modified Example 2, the coupling hole may be used in common as with Modified Example 1.

Modified Example 3

Capacitive Coupling Field Plate Part

Figure 25:
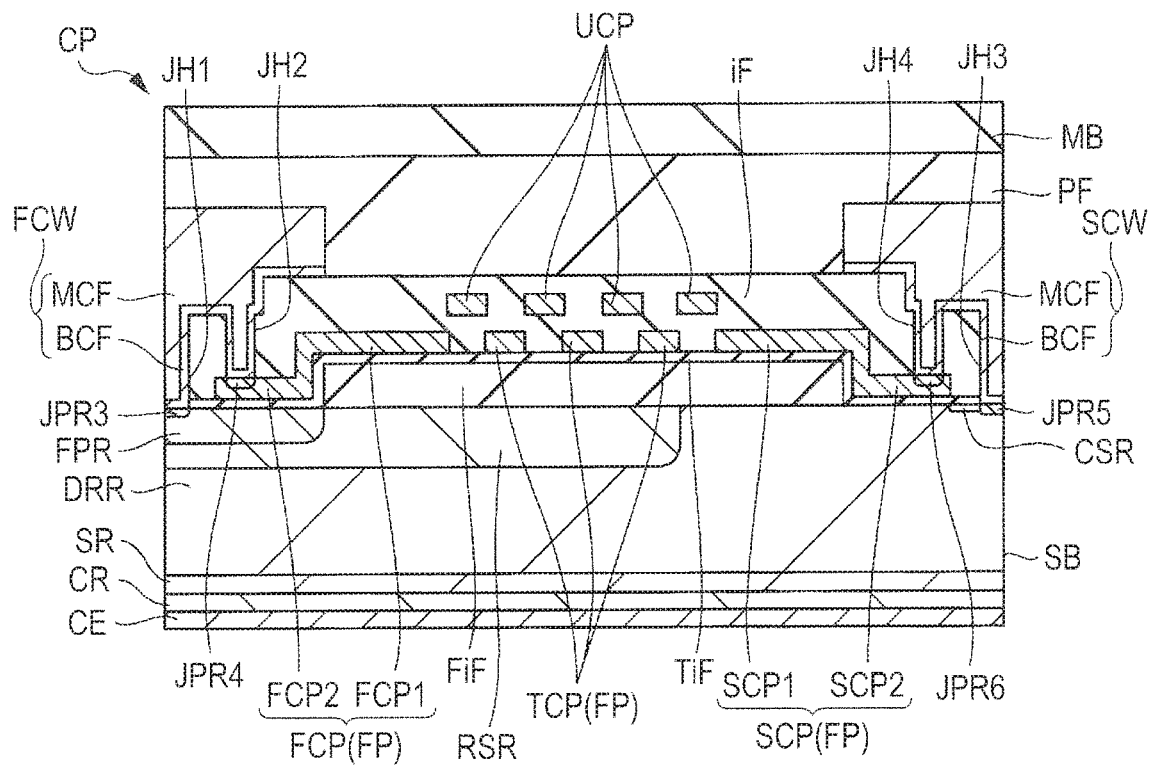
FIG. 25 is a cross sectional view of a part corresponding to line II-II of FIG. 4 in a semiconductor device of Modified Example 3 of First Embodiment.
Figure 26:
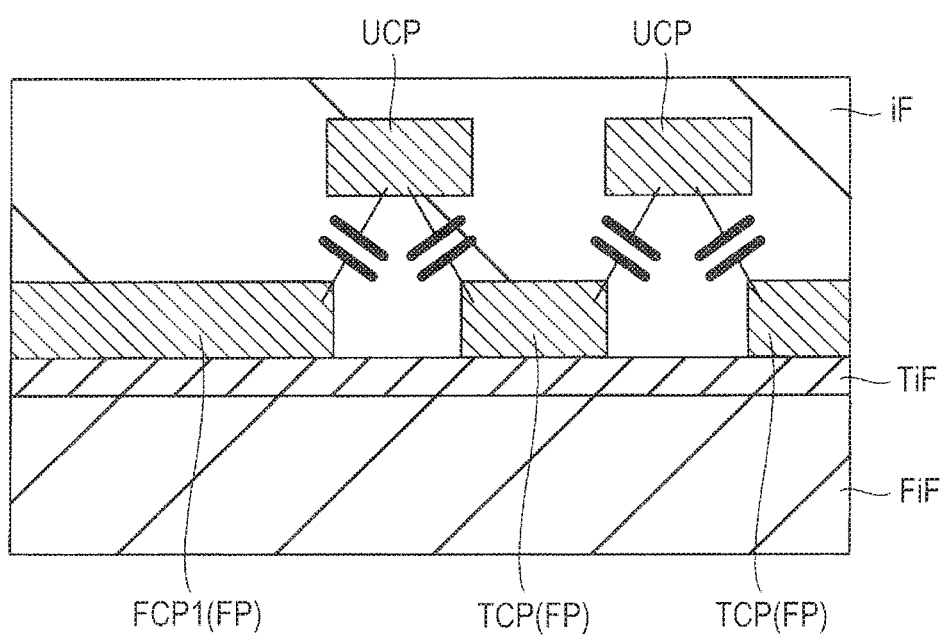
FIG. 26 is an essential part enlarged cross sectional view of the semiconductor chip of FIG. 25.

FIG. 25 is a cross sectional view of a part corresponding to line II-II of FIG. 4 in a semiconductor device of Modified Example 3 of First Embodiment; and FIG. 26 is an essential part enlarged cross sectional view of the chip of FIG. 25.

In Modified Example 3, as shown in FIGS. 25 and 26, at the upper layer of the resistive field plate part FP, a conductor pattern UCP is provided. The conductor pattern UCP is formed of, for example, polysilicon, and is formed in a spiral shape in a plan view in such a manner as to fill between the adjacent underlying conductor patterns FCP, TCP, and SCP. Thus, the conductor pattern UCP is arranged in such a manner as to fill between the adjacent conductor patterns FCP, TCP, and SCP. As a result, an external charge can be blocked.

Further, the overlying conductor pattern UCP is set in a floating state. However, the overlying conductor pattern UCP overlaps parts of the underlying conductor patterns FCP, TCP, and SCP in a plan view as shown in FIG. 26, and is electrically coupled with the conductor patterns FCP, TCP, and SCP by capacitive coupling. That is, the overlying conductor pattern UCP is capacitively coupled with the stable electric potential of the resistive field plate part FP, and functions as a capacitive field plate part. This can result in a strong structure against an external charge, so that the reliability of the peripheral region PR of the chip CP can be more improved. Further, the provision of the overlying conductor pattern UCP increases the thickness of the insulation film iF. However, the second problem is not caused. That is, without causing the problem of the coupling hole, it is possible to improve the reliability of the peripheral region PR. However, the overlying conductor pattern UCP may be electrically coupled with the underlying conductor patterns FCP, TCP, and SCP through the coupling hole, and thereby to be allowed to function as a resistive field plate part. Incidentally, the thickness of the overlying conductor pattern UCP is, for example, about 500 to 600 nm. Still further, the overlying conductor pattern UCP includes an impurity at a prescribed density so as to achieve a prescribed resistance value.

Other configurations than this are the same as those of the First Embodiment. Further, also in the case of Modified Example 3, the coupling hole may be used in common as with Modified Example 1. Further, also in the case of Modified Example 3, as with Modified Example 2, the coupling hole may not be arranged at the corner part, and may be allowed to extend between the corner part and the corner part.

Modified Example 4

Figure 27:
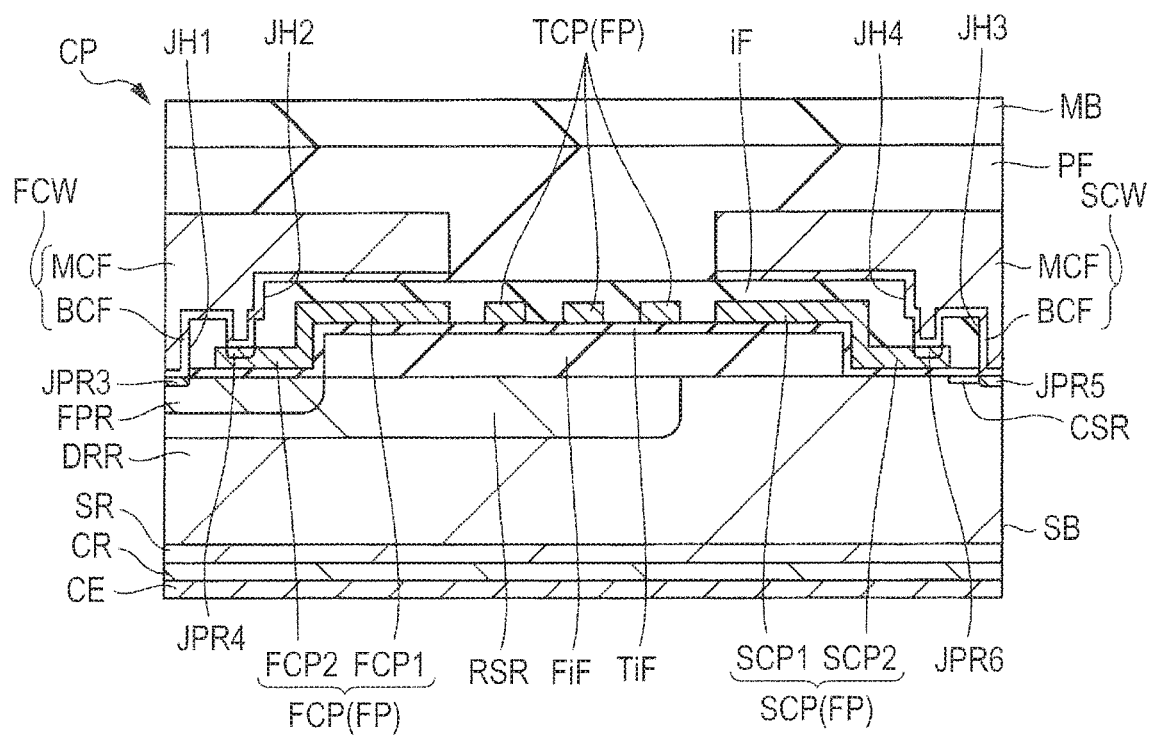
FIG. 27 is a cross sectional view of a part corresponding to line II-II of FIG. 4 in a semiconductor device of Modified Example 4 of First Embodiment.

FIG. 27 is a cross sectional view of a part corresponding to line II-II of FIG. 4 in a semiconductor device of Modified Example 4 of First Embodiment.

Some semiconductor devices have a structure in which the adhesion between the surface protective film of the chip and the sealing body is good, and the release therebetween is not caused during a moisture resistance test, and a moisture is less likely to penetrate into the package. In this case, the problem of corrosion of the internal circulation wire or the external circulation wire is less likely to be caused. For this reason, as shown in FIG. 27, the outer circumference end of the internal circulation wire FCW, and the outer circumference end of the inner conductor pattern FCP (main part FCP1) of the underlying resistive field plate part FP are not required to be separated from each other. Further, similarly, the inner circumference end of the external circulation wire SCW, and the inner circumference end of the outer conductor pattern SCP (main part SCP1) of the underlying resistive field plate part FP are not required to be separated from each other.

However, also in this case, as with the First Embodiment, the coupling hole JH2 for electrically coupling the internal circulation wire FCW and the inner conductor pattern FCP is arranged at the lead-out part FCP2 formed over the thin insulation film TiF. Further, the coupling hole JH4 for electrically coupling the external circulation wire SCW and the outer conductor pattern SCP is arranged at the lead-out part SCP2 formed over the thin insulation film TiF. This can cope with the second problem.

Other configurations than this are the same as those of the First Embodiment. Further, also in the case of Modified Example 4, as with Modified Example 1, the coupling hole may be used in common. Furthermore, also in the case of Modified Example 4, as with Modified Example 2, the coupling hole may not be arranged at the corner part, and may be allowed to extend between the corner part and the corner part. Further, also in the case of Modified Example 4, as with Modified Example 3, a capacitive field plate part may be arranged at the overlying layer of the resistive field plate part.

Up to this point, the invention completed by the present inventors was specifically described by way of embodiments thereof. However, it is naturally understood that the present invention is not limited to the embodiments, and may be variously changed within the scope not departing from the gist thereof.

For example, in the embodiment, a description has been given to a semiconductor device including a transistor provided therein. However, the present invention is not limited thereto, and is also applicable to a semiconductor device including a diode in place of the transistor provided therein. Incidentally, when the present invention is applied to a diode, the emitter electrode becomes an anode electrode, and the collector electrode becomes a cathode electrode.

Further, in the embodiment, the planar configuration of the intermediate conductor pattern of the resistive field plate part is formed in a spiral shape. However, the present invention is not limited thereto, and the configuration may be variously changed. In this case, the intermediate conductor pattern may desirably electrically couple the inner conductor pattern and the outer conductor pattern, or may be divided into a plurality of groups along the outer circumference direction of the chip.

What is claimed is:
1. A semiconductor device, comprising:
a semiconductor substrate forming a semiconductor chip;
an element region arranged at a first surface of the semiconductor substrate;
an element arranged in the element region;

a first semiconductor region of first conductivity type provided at the first surface in such a manner as to surround the element region in a plan view;

a first insulation film provided over the first surface in such a manner as to surround the first semiconductor region in a plan view;

a second insulation film provided over the first surface inside and outside the first insulation film in a plan view, and, thinner than the first insulation film in a cross sectional view;

a conductor plate part provided over the first insulation film and the second insulation film in such a manner as to surround the element region in a plan view;

a third insulation film provided over the first surface in such a manner as to cover the first insulation film, the second insulation film, and the conductor plate part in a cross sectional view;

a first metal pattern provided over the third insulation film in such a manner as to surround the element region inside the conductor plate part in a plan view, and, electrically coupled with a first electrode of the element and the first semiconductor region; and a second metal pattern provided over the third insulation film in such a manner as to surround the first metal pattern outside the conductor plate part in a plan view, and, electrically coupled with a second electrode of the element, wherein the conductor plate part includes:

a first conductor pattern arranged in such a manner as to surround the element region in a plan view;

a second conductor pattern arranged in such a manner as to surround the first conductor pattern in a plan view; and a third conductor pattern arranged between the first conductor pattern and the second conductor pattern in a plan view, and, for electrically coupling the first conductor pattern and the second conductor pattern, wherein the first metal pattern and the first conductor pattern are electrically coupled through a first coupling hole arranged in a region where the first metal pattern and the first conductor pattern overlap each other in a plan view, wherein the second metal pattern and the second conductor pattern are electrically coupled through a second coupling hole arranged in a region where the second metal pattern and the second conductor pattern overlap each other in a plan view, and wherein the outer circumference end of the first metal pattern is separated from the outer circumference end of the first conductor pattern toward the element region.

2. The semiconductor device according to claim 1, wherein the outer circumference end of the first metal pattern is arranged inside the inner circumference end of the first insulation film.

3. The semiconductor device according to claim 2, wherein the outer circumference end of the first metal pattern is arranged inside the outer circumference end of the first semiconductor region.

4. The semiconductor device according to claim 1, wherein the interval between the outer circumference end of the first metal pattern and the outer circumference end of the first conductor pattern is 1 μm or more.

5. The semiconductor device according to claim 1, wherein the inner circumference end of the second metal pattern is separated from the inner circumference end of the second conductor pattern toward the outer circumference of the semiconductor chip.

6. The semiconductor device according to claim 5, wherein the inner circumference end of the second metal pattern is arranged outside the outer circumference end of the first insulation film.

7. The semiconductor device according to claim 5, wherein the interval between the inner circumference end of the second metal pattern and the inner circumference end of the first conductor pattern is 1 μm or more.

8. The semiconductor device according to claim 1, wherein the first conductor pattern has a first extension part extending inside the inner circumference end of the first insulation film, and between the second insulation film and the third insulation film in a cross sectional view, wherein the first metal pattern and the first extension part are electrically coupled through the first coupling hole arranged in a region where the first metal pattern and the first extension part overlap each other in a plan view, and formed in the third insulation film in a cross sectional view, wherein the second conductor pattern has a second extension part extending outside the outer circumference end of the first insulation film, and between the second insulation film and the third insulation film in a cross sectional view, wherein the second metal pattern and the second extension part are electrically coupled through the second coupling hole arranged in a region where the second metal pattern and the second extension part overlap each other in a plan view, and, formed in the third insulation film in a cross sectional view, and wherein the first metal pattern and the first semiconductor region are electrically coupled through a third coupling hole arranged in a region where the first metal pattern and the first semiconductor region overlap each other in a plan view, and, formed in the second insulation film and the third insulation film in a cross sectional view.

9. The semiconductor device according to claim 8, wherein in a cross sectional view, the length from the first surface to the bottom surface of the first coupling hole and the bottom surface of the second coupling hole is smaller than the length from the first surface to the upper surface of the first insulation film.

10. The semiconductor device according to claim 1, wherein the first conductor pattern has a first extension part extending inside the inner circumference end of the first insulation film, and between the second insulation film and the third insulation film in a cross sectional view, and wherein the first metal pattern internally includes a part of the first extension part and a part of the first semiconductor region in a plan view, and, is electrically coupled with both of the first extension part and the first semiconductor region through a first common coupling hole formed in the second insulation film and the third insulation film in a cross sectional view.

11. The semiconductor device according to claim 1, wherein the second conductor pattern has a second extension part extending outside the outer circumference end of the first insulation film, and between the second insulation film and the third insulation film in a cross sectional view, wherein the second metal pattern internally includes apart of the second extension part and a part of a second semiconductor region of the first conductivity type formed at the semiconductor substrate, and, is electrically coupled with both of the second extension part and the second semiconductor region through a second common coupling hole formed in the second insulation film and the third insulation film in a cross sectional view.

12. The semiconductor device according to claim 1, wherein the first coupling hole is not arranged at the corner part of the first metal pattern in a plan view, and is arranged in a state extending between the corner part and the corner part of the first metal pattern.

13. The semiconductor device according to claim 1, wherein the second coupling hole is not arranged at the corner part of the second metal pattern in a plan view, and is arranged in a state extending between the corner part and the corner part of the second metal pattern.

14. A semiconductor device, comprising:
a semiconductor substrate forming a semiconductor chip;
an element region arranged in a first surface of the semiconductor substrate;
an element arranged at the element region;
a first semiconductor region of a first conductivity type provided at the first surface in such a manner as to surround the element region in a plan view;
a first insulation film provided over the first surface in such a manner as to surround the first semiconductor region in a plan view;
a second insulation film provided over the first surface inside and outside the first insulation film in a plan view, and, thinner than the first insulation film in a cross sectional view;
a conductor plate part provided over the first insulation film and the second insulation film in such a manner as to surround the element region in a plan view;
a third insulation film provided over the first surface in such a manner as to cover the first insulation film, the second insulation film, and the conductor plate part in a cross sectional view;
a first metal pattern provided over the third insulation film in such a manner as to surround the element region inside the conductor plate part in a plan view, and, electrically coupled with a first electrode of the element and the first semiconductor region; and
a second metal pattern provided over the third insulation film in such a manner as to surround the first metal pattern outside the conductor plate part in a plan view, and, electrically coupled with a second electrode of the element,
wherein the conductor plate part includes:
a first conductor pattern arranged in such a manner as to surround the element region in a plan view;
a second conductor pattern arranged in such a manner as to surround the first conductor pattern in a plan view; and a third conductor pattern arranged between the first conductor pattern and the second conductor pattern in a plan view, and, for electrically coupling the first conductor pattern and the second conductor pattern,
wherein the first conductor pattern has a first extension part extending inside the inner circumference end of the first insulation film, and between the second insulation film and the third insulation film in a cross sectional view,
wherein the first metal pattern and the first conductor pattern are electrically coupled through a first coupling hole arranged in a region where the first metal pattern and the first extension part overlap each other in a plan view, and formed in the third insulation film in a cross sectional view,
wherein the second conductor pattern has a second extension part extending outside the outer circumference end of the first insulation film, and between the second insulation film and the third insulation film in a cross sectional view,
wherein the second metal pattern and the second extension part are electrically coupled through a second coupling hole arranged in a region where the second metal pattern and the second extension part overlap each other in a plan view, and, formed in the third insulation film in a cross sectional view, and
wherein the first metal pattern and the first semiconductor region are electrically coupled through a third coupling hole arranged in a region where the first metal pattern and the first semiconductor region overlap each other in a plan view, and, formed in the second insulation film and the third insulation film in a cross sectional view.

15. The semiconductor device according to claim 14, wherein in a cross sectional view, the length from the first surface to the bottom surface of the first coupling hole and the bottom surface of the second coupling hole is smaller than the length from the first surface to the upper surface of the first insulation film.

16. The semiconductor device according to claim 14, wherein the first coupling hole is not arranged at the corner part of the first metal pattern in a plan view, and is arranged in a state extending between the corner part and the corner part of the first metal pattern.

17. The semiconductor device according to claim 14, wherein the second coupling hole is not arranged at the corner part of the second metal pattern in a plan view, and is arranged in a state extending between the corner part and the corner part of the second metal pattern.

* * * * *